(12) United States Patent
Shmilovich et al.

(10) Patent No.: US 11,885,697 B2
(45) Date of Patent: Jan. 30, 2024

(54) MULTI STRAIN GAUGES SENSOR FOR IMPROVED PERFORMANCE

(71) Applicant: EZMEMS LTD., Caesarea (IL)

(72) Inventors: Tsvi Shmilovich, Pardes Hanna-Karkur (IL); Nicola Molinazzi, Kfar Sava (IL)

(73) Assignee: EZMEMS LTD., Caesarea (IL)

( * ) Notice: Subject to any disclaimer, the term of this patent is extended or adjusted under 35 U.S.C. 154(b) by 173 days.

(21) Appl. No.: 17/415,476

(22) PCT Filed: Dec. 19, 2019

(86) PCT No.: PCT/IL2019/051393
§ 371 (c)(1),
(2) Date: Jun. 17, 2021

(87) PCT Pub. No.: WO2020/129069
PCT Pub. Date: Jun. 25, 2020

(65) Prior Publication Data
US 2022/0065716 A1     Mar. 3, 2022

Related U.S. Application Data

(60) Provisional application No. 62/782,538, filed on Dec. 20, 2018.

(51) Int. Cl.
*G01L 1/22* (2006.01)
*G01B 7/16* (2006.01)
(Continued)

(52) U.S. Cl.
CPC .............. *G01L 1/2293* (2013.01); *G01B 7/18* (2013.01); *G01L 1/2262* (2013.01); *H10N 30/302* (2023.02); *H10N 30/802* (2023.02)

(58) Field of Classification Search
None
See application file for complete search history.

(56) References Cited

U.S. PATENT DOCUMENTS

| 4,454,769 A | 6/1984 | Loos |
| 2005/0160823 A1* | 7/2005 | Zdeblick .............. A61N 1/3627 73/715 |

(Continued)

FOREIGN PATENT DOCUMENTS

| DE | 19730991 C1 | 12/1998 |
| DE | 19730991 | * 1/2008 |

(Continued)

*Primary Examiner* — Brandi N Hopkins
*Assistant Examiner* — Nigel H Plumb
(74) *Attorney, Agent, or Firm* — Browdy and Neimark, PLLC

(57) ABSTRACT

A sensor device including a deformable substrate and a plurality of sensing elements formed on or in the deformable substrate, each of the plurality of sensing elements including at least one of a plurality of strain sensitive lines radially extending with respect to a center of the sensor device and a plurality of strain sensitive lines extending along a circular section with respect to the center of the sensor device, and one or more electrically conducting vias formed in the deformable substrate for electrically connecting between one or more of the sensing elements formed on the first side of the deformable substrate and one or more of the sensing elements formed on the second side of the deformable substrate.

20 Claims, 10 Drawing Sheets

(51) Int. Cl.
*H10N 30/30* (2023.01)
*H10N 30/80* (2023.01)

(56) References Cited

U.S. PATENT DOCUMENTS

2017/0219447 A1\* 8/2017 Ovaere ................ G01L 5/0004
2018/0356304 A1\* 12/2018 Hsieh ........................ G01L 1/26

FOREIGN PATENT DOCUMENTS

| DE | 102006034086 A1 | 1/2008 |
| WO | 2018/092130 A1 | 5/2018 |
| WO | 2018/235087 A1 | 12/2018 |

\* cited by examiner

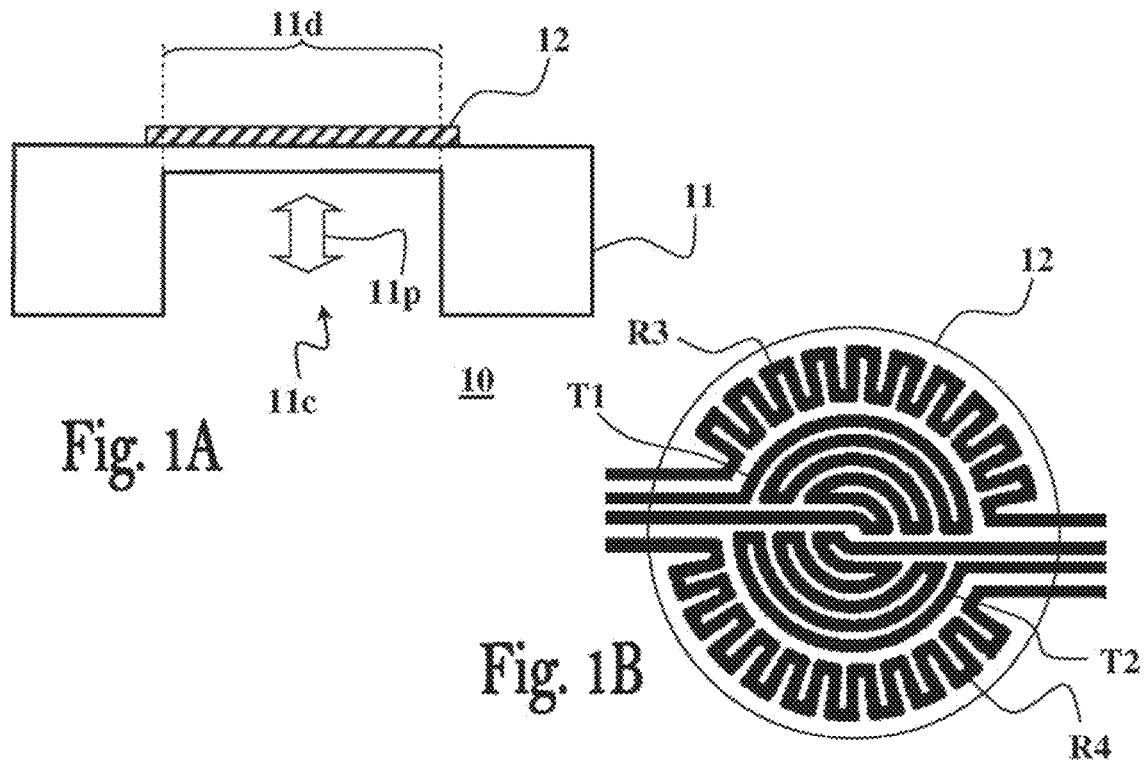
Fig. 1A
Fig. 1B
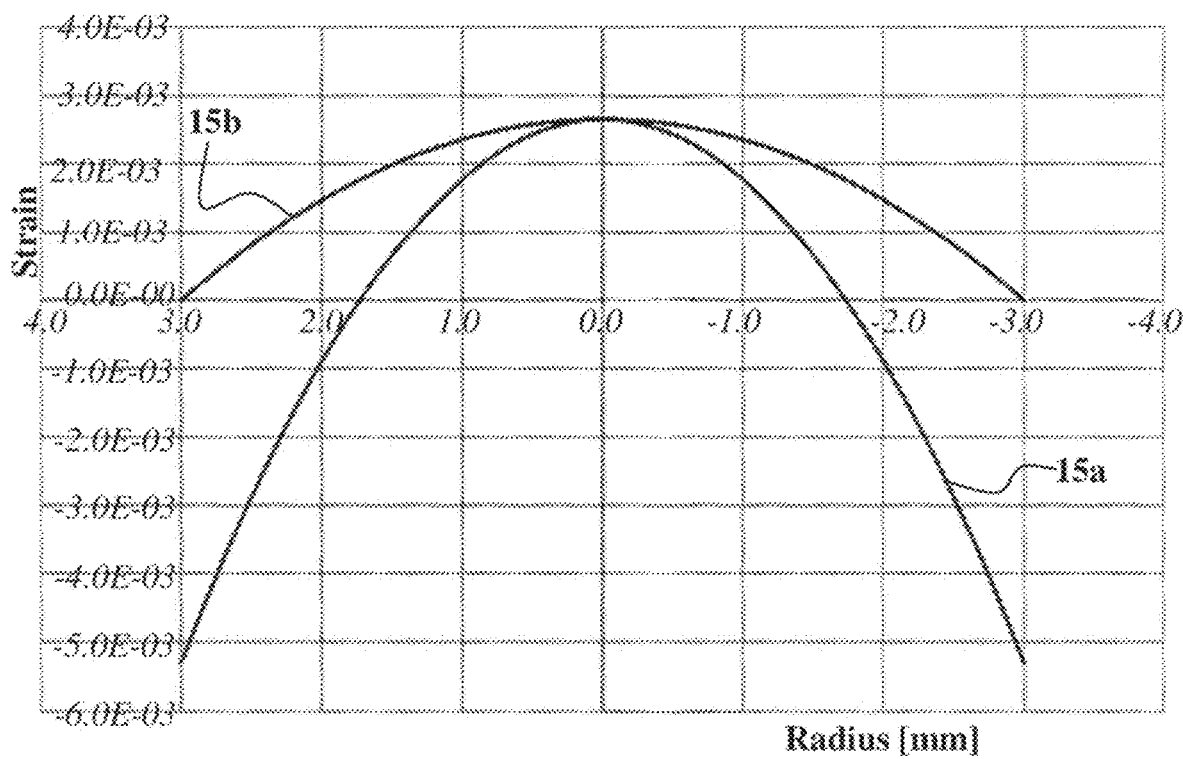
Fig. 1C

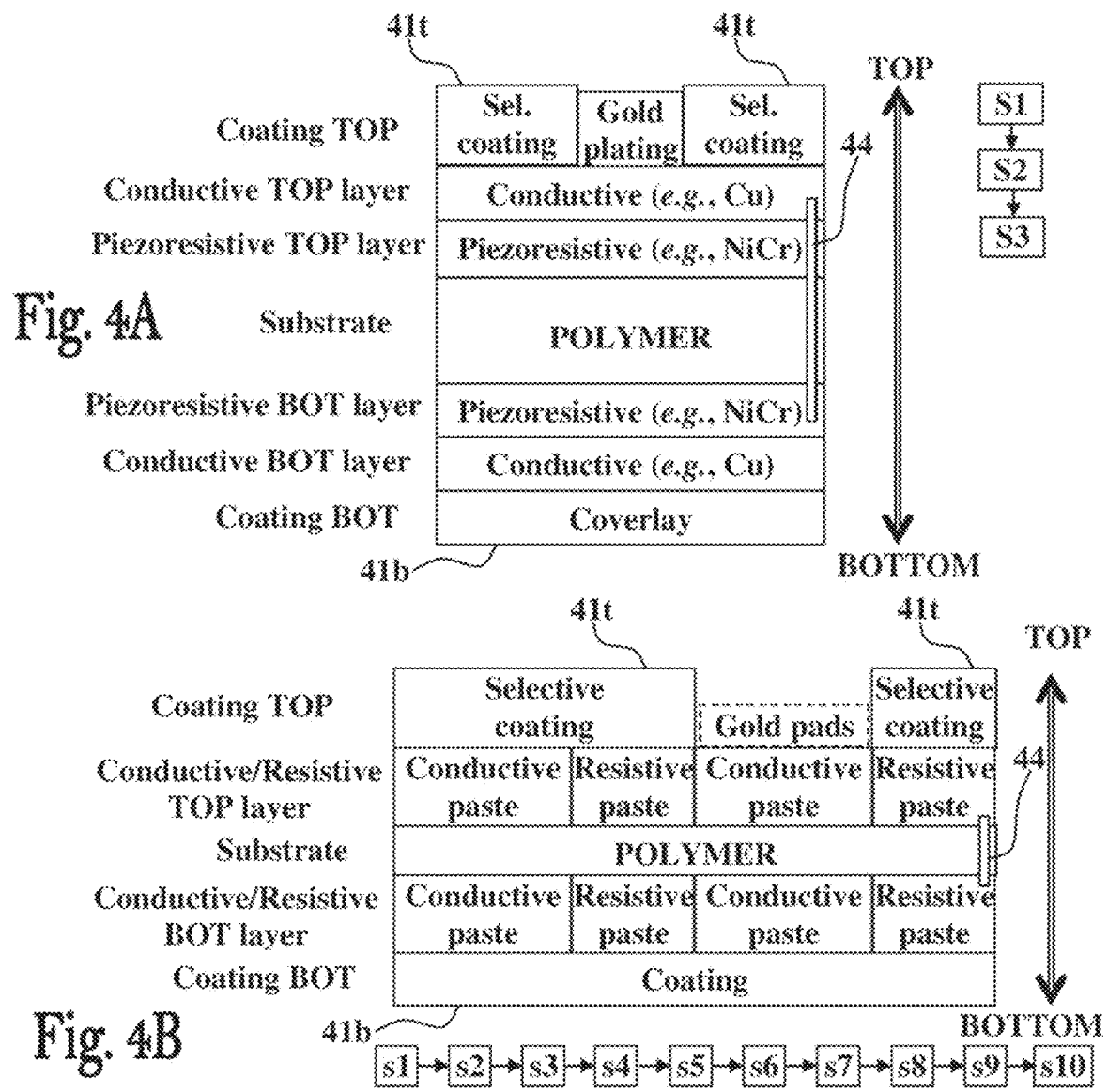
Fig. 4A
Fig. 4B
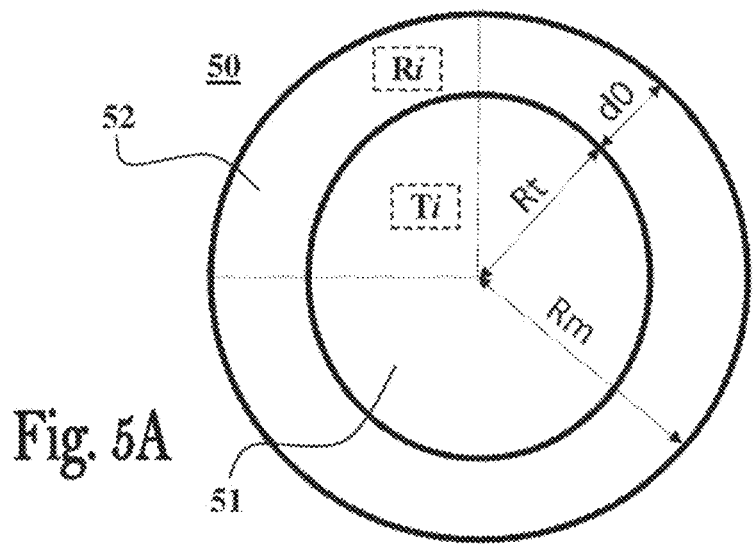
Fig. 5A

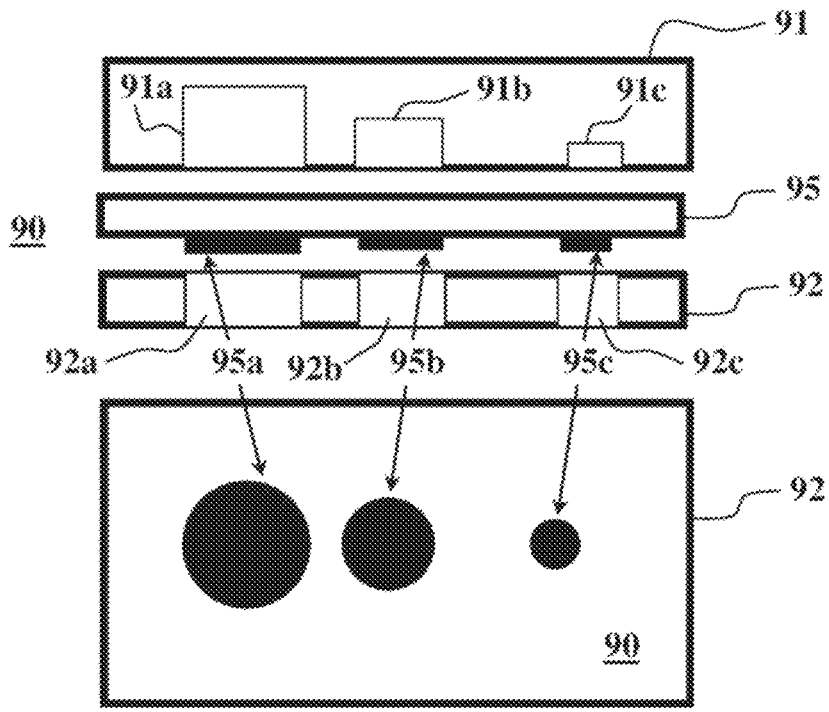
Fig. 9A
Fig. 9B
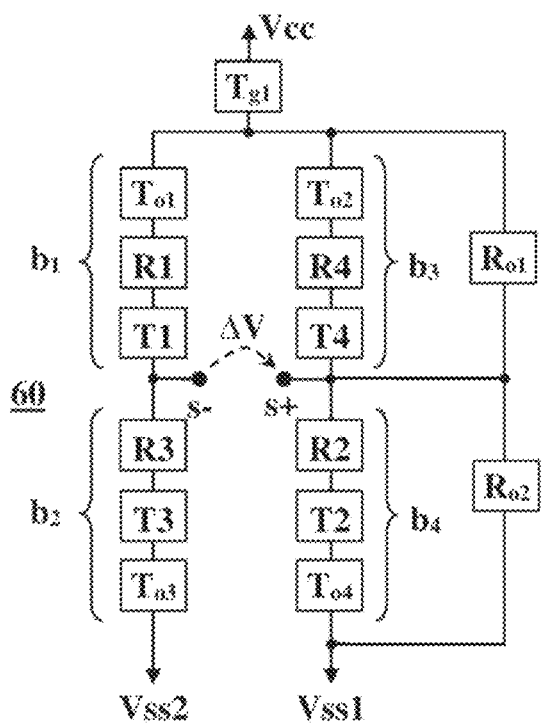
Fig. 6A

MULTI STRAIN GAUGES SENSOR FOR IMPROVED PERFORMANCE

TECHNOLOGICAL FIELD

The present invention is generally in the field of strain gauges, and particularly relates to types of strain gauge designs for MEMS devices.

BACKGROUND

Strain gauge sensors typically include a metallic pattern formed on a deformable electrically insulating substrate designed to be attached to an object for measuring tension/strain thereof. After attaching the strain gauge sensor to the object its metallic pattern is deformed in response to deformations of the object to which it is attached, thereby causing a respective change in at least one electrical property (e.g., resistance) of the sensor, which is indicative of the object's strain according to a known gauge factor of the sensor.

The electrical resistance change of the strain gauge sensor is typically measured using three external resistors that are electrically connected to the strain gauge sensor in a form of a Wheatstone bridge calibrated to be in equilibrium in strain-free/relaxed states of the object. Conventional strain gauge designs do not fully exploit the surface area of the deformable substrate of the sensor, do not allow to build full Wheatstone bridge configurations with strain gauges on both side of the deformable area on a single foil that can be directly and readily attached for measurement on the object that its strain is to be measured, and they are difficult to miniaturize for small/miniature implementations, such as required in micromechanical systems (MEMs). In addition, the conventional strain gauge designs are especially difficult to manufacture and not suitable for implementation on plastic materials due to the poor thermal power dissipation capacity of the plastic substrate to which they are applied/attached.

Some strain sensor configurations know from the patent literature are briefly described hereinbelow.

U.S. Pat. No. 4,454,769 describes a measuring cell comprising two systems of transducers (strain gauges) disposed respectively in two regions of concentration of force of the cell, each system comprising a pair of transducers arranged axially within a plane, the angle enclosed between the plane of the first pair and the plane of the second pair being of 60°. This permits the suppression of the third harmonic in the output signal delivered by a bridge in which the transducers are connected. The opposite arms of the bridge comprise, respectively, a transducer of the first and a transducer of the second pair, the transducers of the first pair and the transducers of the second pair being arranged in the cell symmetrically with respect to the axis of the cell.

German Patent Publication No. 102006034086 describes a cell having a housing with upper and lower parts enclosing an inner area, and a deformation ring extending into the area and surrounding a section of a force transmitting part. The lower part has a diverting plate that locks the inner area together with a force diverting apron. The section is arranged at an axial distance from the plate. Four radially aligned measuring value sensors and four tangentially aligned measuring value sensors are attached to a front surface of the ring and arranged at an equal distance in the circumferential direction.

General Description

Sensor devices formed on deformable substrates (also referred to herein as deformable element) are disclosed. The sensor devices are configured to provide improved performance (e.g., sensitivity, and/or temperature stability, and/or repeatability, and/or linearity, and/or reliability and/or endurance) by combining radial and/or tangential strain gauge elements in bridge circuitries formed from sensor elements of the sensor device. The term tangential strain gauge element generally refers to a strain gauge element having a plurality of arched shaped strain sensitive lines extending on the substrate with respect to a center of the substrate e.g., centered thereabout to interfold one into the other. The term radial strain gauge element generally refers to a strain gauge element having a plurality of strain sensitive lines radially extending on the substrate with respect to a center of the substrate.

The sensors devices disclosed herein are configured to utilize a plurality of tangential and/or radial strain gauge elements arranged on one or two sides of the deformable substrates, such that at least one of the strain gauge elements experience during measurements extension of its strain sensitive lines, and at least another one of the strain gauge elements experience compression of its strain sensitive lines during the measurements. This way strain measurement components obtained due to extension of strain sensitive lines of the at least one strain gauge element are of opposite strain direction with respect to strain measurement components obtained due to compression of the strain sensitive lines of the at least another one of the strain gauge element, thereby maximizing the measurement range and performance.

In some embodiments the sensor device comprises a plurality of sensing elements formed on two sides of a deformable substrate and electrically connected by electrically conducting vias (pass-through bores) made in the deformable substrate for facilitating construction of a bridge circuitry by the sensing elements. The sensor device can comprise at least one radial strain gauge element and at least one tangential strain gauge element.

The sensor device comprises in some embodiments at least two radial strain gauge elements formed on a first side of the deformable substrate, and at least two radial strain gauge elements formed on a second side of the deformable substrate.

Optionally, the sensor device comprises at least two tangential strain gauge elements formed on a first side of the deformable substrate, and at least two tangential strain gauge elements formed on a second side of the deformable substrate. The strain gauge elements can be electrically connected to form a bridge circuitry having two voltage divider branches, wherein each portion of each voltage divider branch comprises at least one radial strain gauge element formed on one side of the deformable substrate and at least one tangential strain gauge element formed on the other side of the deformable substrate.

In some embodiments, a sensor device comprising a plurality of sensing elements formed on an area on at least one side of a deformable substrate comprises an enclosure pattern formed to surround the plurality of sensing elements. The enclosure pattern having a cross section that is thicker than a cross section of the area of the device accommodating the sensing elements, and/or made stiffer than the area of the device accommodating the sensing elements, to thereby substantially prevent misalignment malfunctions and/or errors.

One inventive aspect of the subject matter disclosed herein relates to a sensor device comprising a deformable substrate and a plurality of sensing elements formed on the deformable substrate, where each of the plurality of sensing elements comprises at least one of a plurality of strain sensitive lines radially extending with respect to a center of the deformable substrate and a plurality of arched-shaped strain sensitive lines extending with respect to (e.g., centered about) the center of the deformable substrate. The plurality of sensing elements are arranged on the deformable substrate such that strain components measured due to extension of strain sensitive lines of at least one of the sensing elements are of opposite strain direction with respect to strain components measured due to compression of strain sensitive lines of at least one other of the sensing elements, thereby maximizing performance and measurement range. Electrically conducting lines formed on the deformable substrate can be configured to facilitate construction of one or more, or a plurality of, bridge circuitries on the deformable substrate utilizing the plurality of sensing elements.

The sensor device comprises in some embodiments at least one radial sensing element comprising the plurality of radially extending strain sensitive lines and at least one tangential sensing element comprising the plurality of arched-shaped strain sensitive lines. Optionally, the tangential sensing element is at least partially accommodated within a pattern formed by the at least one radial sensing element. In some embodiments the plurality of sensing elements are formed on first and second sides of the deformable element. In such embodiments the deformable substrate can comprise one or more electrically conducting vias for electrically connecting between the sensing elements formed on the first and second sides of the deformable substrate.

The sensor device may comprise at least two radial sensing elements comprising the plurality of radially extending strain sensitive lines on a peripheral region of the first side of the deformable substrate, and at least two radial strain gauge elements comprising the plurality of radially extending strain sensitive lines on a peripheral region of the second side of the deformable substrate. Alternatively, the sensor device may comprise at least two tangential sensing elements comprising the plurality of arched-shaped strain sensitive lines on a central region of the first side of the deformable substrate, and at least two tangential strain gauge elements comprising the plurality of arched-shaped strain sensitive lines on a central region of the second side of the deformable substrate.

Optionally, but in some embodiments preferably, the sensor device comprises on each of the first and second sides of the deformable substrate at least four tangential sensing elements comprising the plurality of arched-shaped strain sensitive lines extending on central regions of the first and second sides of the deformable substrate, and at least four radial sensing elements comprising the plurality of radially strain sensitive lines extending on central regions of the first and second sides of the deformable substrate. The sensing elements can be electrically connected to form at least one bridge circuitry having two voltage divider branches, wherein each portion of each voltage divider branch comprises at least one radial sensing element formed on the first side of the deformable substrate and at least one tangential sensing element formed on the second side of the deformable substrate.

Optionally, the sensing elements located on the first side of the deformable substrate are perpendicularly oriented with respect to the sensing elements located on the second side of the deformable substrate.

In some embodiment the sensor device comprises an enclosure pattern formed in the device for surrounding the plurality of sensing elements. The enclosure pattern can have a cross section thicker than a cross section of the area of the device accommodating the sensing elements, and/or that is made of a stiffer material, thereby allowing to substantially prevent misalignment malfunctions and/or errors.

The sensor device comprises in some embodiment at least one piezoresistive layer patterned on at least one side of the deformable substrate, at least one electrically conducting layer patterned at least partially on the at least one piezoresistive layer and on the at least one side of the deformable substrate, and at least one coating layer patterned to partially, or entirely, cover the piezoresistive and electrically conducting layers.

Optionally, but in some embodiments preferably, the sensor device comprises piezoresistive layers patterned on the first and second sides of the deformable substrate, electrically conducting layers patterned at least partially on the piezoresistive layers and the first and second sides of the deformable substrate, and at least one coating layer patterned to substantially cover the piezoresistive and electrically conducting layers on the second side of the deformable substrate, at least one coating layer patterned to selectively cover portions of the piezoresistive and electrically conducting layers on the first side of the deformable substrate, and at least one via for electrically connecting between the electrically conducting layers patterned on the first and second sides of the deformable substrate.

Optionally, but in some embodiments preferably, the sensor device comprises piezoresistive layers patterned on portions of the first and second sides of the deformable substrate, electrically conducting layers patterned on some portions of the first and second sides of the deformable substrate that do not include the piezoresistive layers, and at least one coating layer patterned to substantially cover the piezoresistive and electrically conducting layers on the second side of the deformable substrate, at least one coating layer patterned to selectively cover portions of the piezoresistive and electrically conducting layers on the first side of the deformable substrate, and at least one via for electrically connecting between the electrically conducting layers patterned on the first and second sides of the deformable substrate.

The sensor device can comprise an electrically interfacing layer selectively patterned on portions of the electrically conducting layers on the first side of the deformable substrate that are not covered by the selectively patterned at least one coating layer. The sensor device may also comprise at least one trimming element electrically connected to at least one of the sensing elements.

Sensor assemblies comprising two of more of the sensor devices described hereinabove, or hereinbelow, can be formed on the deformable substrate, such that each of the two of more of the sensor devices is configured to measure a different range or a different parameter of a fluid media. The sensor assembly may comprise a cover member configured to attach to one side of the deformable substrate and having two or more cavities, each of these cavities having dimension and location configured to engage a portion of the deformable substrate carrying a respective one of the two or more sensor devices, and an attachment member configured to attach to another side of the deformable substrate and having two or more pass-through bores, each of these pass-through bores having location and dimension configured to engage a portion of the deformable substrate carrying a respective one of the two or more sensor devices.

In some embodiment the sensor device comprises a plurality of sensing elements formed on an area on at least one side of a deformable substrate, and an enclosure pattern formed in the device for surrounding the plurality sensing element. The enclosure pattern can have a cross section thicker than a cross section of the area of the device accommodating the sensing elements, and/or it can be made of a stiffer material, thereby allowing to substantially prevent misalignment malfunctions and/or errors.

Another inventive aspect of the subject disclosed herein refers to a method of making a sensor device comprising patterning at least one piezoresistive layer on at least one side of a deformable substrate to form at least one sensing element having a plurality of strain sensitive lines radially extending with respect to a center of the deformable substrate, or a plurality of arched-shaped strain sensitive lines extending about the center of the deformable substrate, patterning at least one electrically conducting layer at least partially on the at least one piezoresistive layer and on the at least one side of the deformable substrate for establishing electrical contact with the at least one sensing element, and applying at least one coating layer to partially, or entirely, cover the piezoresistive and electrically conducting layers.

The method comprises in some embodiments patterning the at least one piezoresistive layer on the first and second sides of the deformable substrate, forming at least one electrically conducting via in the deformable substrate for electrically connecting between the electrically conducting layers patterned on the first and second sides of the deformable substrate, patterning the at least one electrically conducting layer at least partially on the piezoresistive layers and the first and second sides of the deformable substrate, patterning the at least one coating layer to substantially cover the piezoresistive and electrically conducting layers on the second side of the deformable substrate, and patterning at least one coating layer to selectively cover portions of the piezoresistive and electrically conducting layers on the first side of the deformable substrate.

In some embodiment, the method comprising patterning the at least one piezoresistive layer on portions of the first and second sides of the deformable substrate, patterning the at least one electrically conducting layer on some portions of the first and second sides of the deformable substrate not including the piezoresistive layers, forming at least one electrically conducting via in the deformable substrate for electrically connecting between the electrically conducting layers patterned on the first and second sides of the deformable substrate, applying at least one coating layer to substantially cover the piezoresistive and electrically conducting layers on the second side of the deformable substrate, and applying at least one coating layer to selectively cover portions the piezoresistive and electrically conducting layers on the first side of the.

The method can comprise selectively patterning an electrically interfacing layer on portions of the electrically conducting layers on the first side of the deformable substrate that are not covered by the selectively patterned at least one coating layer. Optionally, the patterning of the at least one piezoresistive layer is configured to form at least one trimming element, and the patterning of the at least one electrically conducting layer is configured to electrically connect between the at least one sensing element and the at least one trimming element. The method can comprise trimming the at least one trimming element before the applying of the at least one coating layer.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which:

FIGS. 1A to 1C schematically illustrate a strain gauge device having tangential and radial piezoresistive elements, wherein FIG. 1A shows possible structure of a strain gauge device, FIG. 1B shows a possible arrangement of radial and tangential strain gauges on a deformable element, and FIG. 1C shows strain plots of tangential and radial strain gauges;

FIG. 2A to FIG. 2F schematically illustrate possible arrangements of tangential and radial piezoresistive elements on, or in, a deformable element, according to some possible embodiments, wherein FIG. 2A shows arrangement of four piezoresistive elements on one side of the deformable element, FIG. 2B shows arrangement of four piezoresistive elements on two sides of the deformable element, FIG. 2C shows another possible arrangement of four piezoresistive elements on two sides of the deformable element, FIG. 2D shows arrangement of eight piezoresistive elements on two sides of the deformable element, FIGS. 2E and 2F show possible bridge circuitries obtained in some embodiments utilizing the eight piezoresistive elements arrangement illustrated in FIG. 2D;

FIGS. 4A and 4B schematically illustrate techniques for constructions strain gauge devices according to some possible embodiments;

FIGS. 5A to 5E schematically illustrate different strain gauge device configurations according to some possible embodiments, wherein FIG. 5A shows a possible architecture of a strain gauge device, and FIGS. 5B to 5E show plots of measureable strains for different sizes of the strain gauge device of FIG. 5A;

FIGS. 6A to 6C schematically illustrate a sensor device according to some possible embodiments, wherein FIG. 6A shows a schematic illustration of a bridge circuitry of the sensor device, and FIGS. 6B and 6C show top and bottom views of a multilayered implementation of the sensor device.

FIGS. 9A and 9B schematically illustrate an arrangement of sensor devices configured according to some possible embodiments for simultaneously measuring different parameters and/or different ranges of a property and/or condition of a fluid substance, wherein FIG. 9A is a sectional exploded view, and FIG. 9B is a bottom view, of the device.

DETAILED DESCRIPTION OF EMBODIMENTS

Figure 2A:
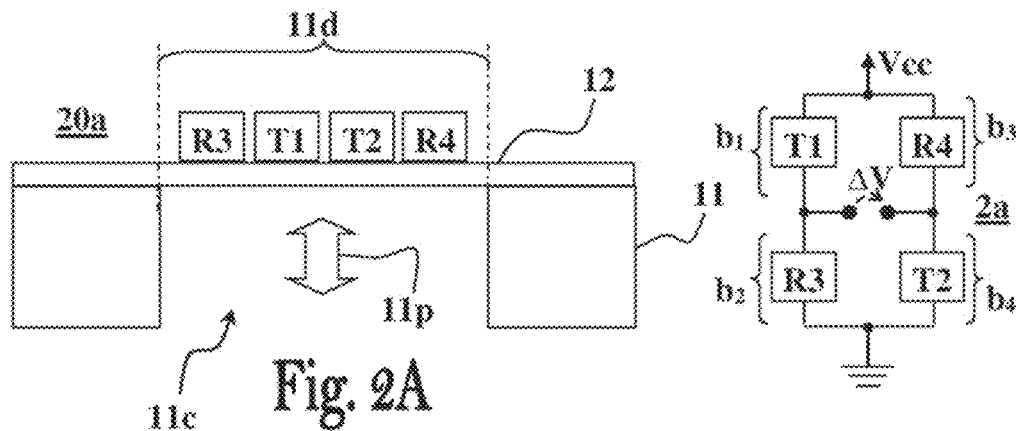

One or more specific embodiments of the present disclosure will be described below with reference to the drawings, which are to be considered in all aspects as illustrative only and not restrictive in any manner. In an effort to provide a concise description of these embodiments, not all features of an actual implementation are described in the specification. Elements illustrated in the drawings are not necessarily to scale, or in correct proportional relationships, which are not critical. Emphasis instead being placed upon clearly illustrating the principles of the invention such that persons skilled in the art will be able to make and use the sensor devices, once they understand the principles of the subject matter disclosed herein. This invention may be provided in other specific forms and embodiments without departing from the essential characteristics described herein.

The present application discloses sensor devices implemented by sensor elements formed on two sides of a deformable substrate (e.g., thin film or foil), and electrically connected through electrically conducting vias made in the deformable substrate for facilitating construction of bridge circuitries from the sensor elements. The sensor elements can be implemented by radial strain gauge elements, and/or by tangential strain gauge elements. Optionally, but in some embodiments preferably, the sensor device is a multilayered structure formed on the deformable substrate.

A first layer applied on first and/or second sides of the deformable substrate can be a piezoresistive layer patterned to form strain gauge elements, and optionally trimming elements, of the sensor device. An electrically conducting layer can be patterned on the first and/or second sides of the structure to form electrically conducting lines and contact pads of the sensor device, and an electrically conducting protective coating layer can be patterned over the contact pads. An electrical non-conducting layer can be then applied/patterned on the first and/or second sides of the structure for covering the strain gauge elements and conducing lines, of the sensor device.

FIG. 1A shows a sensor 10 comprising a strain gauge device 12 attached to an object 11. In this specific and non-limiting example the object 11 comprises a cavity or fluid flow path 11e, and the strain gauge device 12 is attached over a deformable section (also referred to herein as deformable element) 11d of the object 11 that can be pulled inwardly into the cavity or fluid flow path 11e, or pushed outwardly from the cavity or fluid flow path 11e, responsive to fluid pressure 11p evolving inside the cavity or fluid flow path 11e.

FIG. 1B shows a possible arrangement of radial and tangential strain gauges on the deformable section 11d, that is useful for full Wheatstone bridge implementations (e.g., formed on a top surface area of the deformable section 11d). The strain gauge device 12 in this non-limiting example is generally of circular shape, and comprises two radial strain gauge elements, R3 and R4, and two tangential strain gauge elements T1 and T2. In some embodiments the conductors (also referred to herein as strain sensitive lines) of strain gauge elements comprise piezoresistive line patterns configured to provide the radial configuration of the radial strain gauge elements, R3 and R4, and the tangential configuration of the tangential strain gauge elements T1 and T2.

As seen in FIG. 1B, a substantial amount of the piezoresistive/conducting lines of the radial strain gauge elements, R3 and R4, radially extend relative of a center of the device 12, The piezoresistive conductors (strain sensitive lines) of the radial strain gauge elements, R3 and R4, have square-wave alternating patterns extending along respective opposite circular peripheral sections of the strain gauge device 12. The square-wave alternating patterns of the radial strain gauge elements, R3 and R4, are arched about the center of the device 12, such that substantial portions of their lengths radially extend along their respective circular peripheral sections, and thus primarily being subject to radial strain.

As also seen in FIG. 1B, a substantial amount of the piezoresistive/conducting lines of the tangential strain gauge elements, T1 and T2, are arched about the center of the device 12. Each of the tangential strain gauges, T1 and T2, is made from a plurality of interconnected arc-shaped piezoresistive lines/strain sensitive lines alternatingly interfolded one into the other to substantially cover a half circle section accommodated within a respective one of the tangential strain gauge elements. Particularly, the tangential strain gauge element T1 is accommodated within the circular sector formed by, and partially enclosed in, the radial strain gauge element R3, and the tangential strain gauge element T2 is accommodated within the circular sector formed by, and partially enclosed in, the radial strain gauge element R4. This configuration of the tangential strain gauge elements, T1 and T2, provides that substantial portions of their lengths extends over angular sections of their circular sectors, such that they are being primarily subject to tangential strain.

FIG. 1C shows plots, 15a and 15b, of strains measured by radial and tangential strain gauge elements, T1 and T2, respectively, with respect to a radius of the deformable substrate to which they are attached. As seen, the strains 15b measured by the tangential strain gauge elements, T1 and T2, are always positive, because the conductors/strain sensitive lines of the tangential strain gauge elements are primarily arc-shaped, and hence they are mainly subject to extensions due to the deformations of the deformable section 11d. On the other hand, the strains 15a measured by the radial strain gauge elements, R3 and R4, measure negative strains caused by compressions of the portions of the radial conductors/strain sensitive lines extending towards the outer edge of the strain gauge device 12.

FIGS. 2A to 2D schematically illustrate possible arrangements of tangential piezoresistive elements Ti and radial piezoresistive elements Ri (where 1≤i≤4 is an integer) according to some possible embodiments. FIG. 2A shows a strain gauges arrangement 20a, similar to that shown in FIG. 1B, wherein two tangential piezoresistive elements, T1 and T2, are formed on one side and about the center of the deformable element 11d, and two radial piezoresistive elements, R3 and R4, are formed on the same side of the deformable element 11d, where each radial piezoresistive element, R3 and R4, is formed about, to at least partially enclose, a respective one of the tangential piezoresistive elements, T1 and T2.

FIG. 2A further shows a possible Wheatstone bridge circuitry 2a, wherein the tangential piezoresistive element T1 and the radial piezoresistive element R3, formed over one side on top of the deformable element 11d, are serially connected to form a first voltage divider of a first branch of the bridge circuitry 2a, and the radial piezoresistive element R4 and the tangential piezoresistive element T2, formed over one side on top of the deformable element 11d, are serially connected to form a second voltage divider of a second branch of the bridge circuitry 2a. Optionally, but in some embodiments preferably, the arched conductors/strain sensitive lines of the tangential piezoresistive element T1 are at least partially enclosed in the arched wavy structure of the radial piezoresistive element R3 serially connected therewith in the bridge circuitry 2a, and the arched conductors/strain sensitive lines of the tangential piezoresistive element T2 are at least partially enclosed in the arched wavy structure of the radial piezoresistive element R4 serially connected therewith in the bridge circuitry 2a.

In the first branch (b1-b2) the radial piezoresistive element R3 is electrically connected to the electric ground, and in the second branch (b3-b4) the tangential piezoresistive element T2 is electrically connected to the electric ground. This way, under increasing positive pressure increase the electrical resistance values of the tangential piezoresistive elements T1 and T2 increase, while the electrical resistances of the radial piezoresistive elements R3 and R4 decreases, thereby maximizing the range of the output voltage ΔV measurable by the full bridge circuitry 2a.

In the configuration of FIG. 2A, assuming that the tangential piezoresistive elements T1 and T2 act as extension strain gauges which electrical resistance is increased by ΔT in response to deformation of the deformable element 11d such that T1=T2=T+ΔT, and assuming that radial piezoresistive elements R3 and R4 act as compression strain gauges which electrical resistance is decreased by ΔR in response to deformation of the deformable element 11d such that R3=R4=R−ΔR, then the output of the bridge circuitry 2a can be expressed by the ratio of the output voltage ΔV to the input voltage V=Vcc, as follows—

$$\frac{\Delta V}{V} = \frac{T - R + \Delta R + \Delta T}{T + R - \Delta R + \Delta T} \quad (1)$$

In this case, if the same average tangential and radial strains ΔR=ΔT are sensed by the strain gauges, and if R=T, then the expression of equation (1) becomes—

$$\frac{\Delta V}{V} = \frac{\Delta R}{R} = \frac{\Delta T}{T}.$$

On the other hand, if R=T, as typically required for balancing the bridge circuitry i.e., to "zero" the offset voltage of the bridge circuitry, and the average tangential and radial strains sensed by the strain gauges are not the same e.g., ΔR=2ΔT, then the expression of equation (1) becomes—

$$\frac{\Delta V}{V} = \frac{3\Delta T}{2T - \Delta T},$$

which yields a non-linear relationship. In order to achieve linearity the strain gauges design cannot be optimized to maximize sensitivity, but rather needs to focus on equalizing the average strain measured by the radial and the tangential strain gauges. Specifically, there is very delicate balance of parameters in this case due to the requirements to equalize the resistance values (i.e., to achieve T=R) for zeroing the bridge offset voltage, to obtain substantially same average strain sensed by the tangential and radial strain gauges to obtain good linearity, and to maximize the sensitivity of the sensor device. Because the strain profiles of the radial and tangential strain gauges are different, it is difficult to achieve all of these requirements, and practically in some embodiments only the first two requirements are fulfilled. This optimization can be even more difficult, or altogether impossible, if the pressure range to be measured (by the strain gauge elements) is very wide.

Figure 2B:
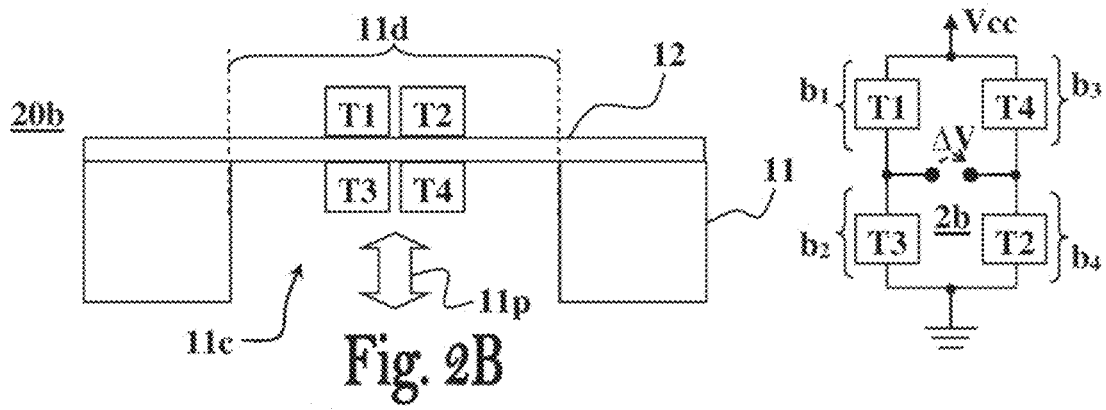

FIG. 2B shows a strain gauges arrangement 20b of four piezoresistive elements formed on two opposite sides of the deformable element 11d. In the strain gauges arrangement 20b, two tangential piezoresistive elements, T1 and T2, are formed on a top surface area, and about a center, of the deformable element 11d, and two tangential piezoresistive elements, T3 and T4, are formed on a bottom surface area, and about the center, of the deformable element 11d. Each pair of tangential piezoresistive elements, (T1 and T2) and (T3 and T4), can be arranged to substantially occupy a circular area of the deformable section 11d, as formed by the tangential strain gauge elements T1 and T2 shown in FIG. 1B. Optionally, and in some embodiments preferably, the orientation of the pair of tangential piezoresistive elements T1 and T2 formed on the top surface area of the deformable element 11d, is substantially perpendicular to the orientation of the pair of tangential piezoresistive elements T3 and T4 formed on the bottom surface area of the deformable element 11d, as shown and described in International Patent Publication No. WO 2018/235087, of the same applicant hereof, the disclosure of which is incorporated herein by reference.

FIG. 2B further shows a possible Wheatstone bridge circuitry 2b, wherein the tangential piezoresistive elements T1 and T3 formed over opposite sides of the deformable element 11d, and optionally in perpendicular orientations one with respect to the other, are serially connected to form a first voltage divider of a first branch of the bridge circuitry 2b, and the tangential piezoresistive elements T4 and T2 formed over respective opposite sides of the deformable element 11d, and optionally in perpendicular orientations one with respect to the other, are serially connected to form a second voltage divider of a second branch of the bridge circuitry 2b. In the first branch the tangential piezoresistive element T3, located on the upper side of the deformable element 11d, is electrically connected to the electric ground, and in the second branch the tangential piezoresistive element T2, located on the bottom side of the deformable element 11d, is electrically connected to the electric ground. This way, the strain components measured due to extension of conductors/strain sensitive lines at one side of the deformable element 11d are opposite strain direction with respect to strain components measured due to compression of the conductors/strain sensitive lines at the other side of the deformable element 11d, and vice versa, thereby maximizing the output voltages ΔV measurable by the full bridge circuitry 2b and maximizing performance.

In the configuration of FIG. 2B, assuming the applied pressure 11p moves the deformable element outwardly, such that the tangential piezoresistive elements T1 and T2 formed on the top side of the deformable element 11d act as extension strain gauge elements, which electrical resistance is increased by ΔT in response to deformation of the deformable element 11d i.e., T1=T2=T+ΔT, and such that the tangential piezoresistive elements T3 and T4 formed on the bottom side of the deformable element 11d act as compression strain gauge elements which electrical resistance is decreased by ΔT in response to deformation of the deformable element 11d i.e., T3=T4=T−ΔT, then the output of the bridge circuitry 2b can be expressed by the ratio of the output voltage ΔV to the input voltage V=Vcc, as follows—

$$\frac{\Delta V}{V} = \frac{\Delta T}{T},$$

and in this case the strain gauges design can be optimized to maximize performance (e.g., sensitivity, and/or temperature stability, and/or repeatability, and/or linearity) by maximizing the strain measurement of each strain gauge element. Ideally the strain gauge elements formed on the two sides of the deformable element have the same or similar properties and strain profiles, which is more likely to be achieved in this case, because the same type of strain gauge elements (i.e., tangential) are formed on both sides of the deformable element.

It is noted that the output of the bridge circuitry 2b has substantially the same absolute value but opposite sign in case the applied pressure 11p moves the deformable element inwardly, in which the top side tangential piezoresistive elements T1 and T2 act as compression strain gauge elements, and the bottom side tangential piezoresistive elements T3 and T4 act as extension strain gauge elements.

Figure 2C:
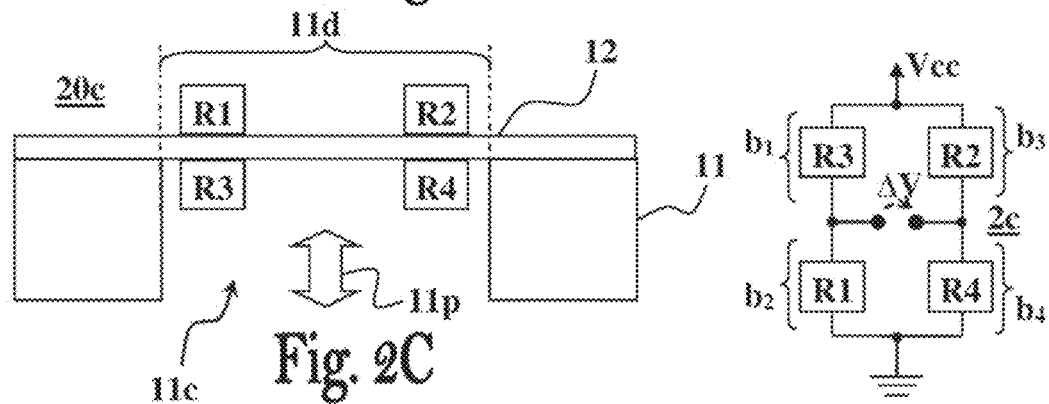

FIG. 2C shows another possible strain gauges arrangement 20c of four piezoresistive elements formed on two opposite sides of the deformable element 11d. In the strain gauges arrangement 20c, two radial piezoresistive elements, R1 and R2, are formed on a top surface area, and over opposite circular peripheral sections of the deformable element 11d, and two radial piezoresistive elements, R3 and R4, are formed on a bottom surface area, and over opposite circular peripheral sections of the deformable element 11d. The pairs of radial piezoresistive elements, (R1 and R2) and (R3 and R4), can be arranged to substantially occupy circular arched-shaped sectors of the deformable element 11d, as formed by the radial strain gauge elements R3 and R4 shown in FIG. 1B. Optionally, and in some embodiments preferably, the orientation of the pair of radial piezoresistive elements R1 and R2 formed on the top surface area of the deformable element 11d, is substantially perpendicular to the orientation of the pair of radial piezoresistive elements R3 and R4 formed on the bottom surface area of the deformable element 11d.

FIG. 2C further shows a possible Wheatstone bridge circuitry 2c, wherein the radial piezoresistive elements R1 and R3 formed over opposite sides of the deformable element 11d, and optionally in perpendicular orientations one with respect to the other, are serially connected to form a first voltage divider of a first branch of the bridge circuitry 2c, and the radial piezoresistive elements R4 and R2 formed over respective opposite sides of the deformable element 11d, and optionally in perpendicular orientations one with respect to the other, are serially connected to form a second voltage divider of a second branch of the bridge circuitry 2c. In the first branch the radial piezoresistive element R1 is electrically connected to the electric ground, and in the second branch the radial piezoresistive element R4 is electrically connected to the electric ground. This way, strain components measured due to extension of conductors/strain sensitive lines at one side of the deformable element 11d are of opposite strain direction with respect to strain components measured due to compression of the conductors/strain sensitive lines at the other side of the deformable element 11d, and vice versa, thereby maximizing the performance (e.g., sensitivity, and/or temperature stability, and/or repeatability, and/or linearity), and output voltages ΔV measurable by the full bridge circuitry 2c.

In the configuration of FIG. 2C, assuming the applied pressure 11p moves the deformable element outwardly, such that the radial piezoresistive elements R1 and R2 formed on the top side of the deformable element 11d act as compression strain gauge elements, which electrical resistance is decreased by ΔR in response to deformation of the deformable element 11d i.e., R1=R2=R−ΔR, and such that the radial piezoresistive elements R3 and R4 act as extension strain gauge elements, which electrical resistance is increased by ΔR in response to deformation of the deformable element 11d i.e., R3=R4=R+ΔR, then the output of the bridge circuitry 2c can be expressed by the ratio of the output voltage ΔV to the input voltage V=Vcc, as follows—

$$\frac{\Delta V}{V} = \frac{\Delta R}{R},$$

and in this case the strain gauges design can be also optimized to maximize performance (e.g., sensitivity, and/or temperature stability, and/or repeatability, and/or linearity), by maximizing the strain measurement of each strain gauge element.

As in FIG. 2B, in the configuration of FIG. 2C the strain gauge elements formed on the two sides of the deformable element have substantially the same or similar properties and strain profiles, because the same type of strain gauge elements (i.e., radial) are formed on both sides of the deformable element. It is noted that the output of the bridge circuitry 2c has substantially the same absolute value but opposite sign in case the applied pressure 11p moves the deformable element inwardly, as in this case the top-side radial piezoresistive elements R1 and R2 act as compression strain gauge elements, and the bottom-side radial piezoresistive elements R3 and R4 act as extension strain gauge elements.

Figure 2D:
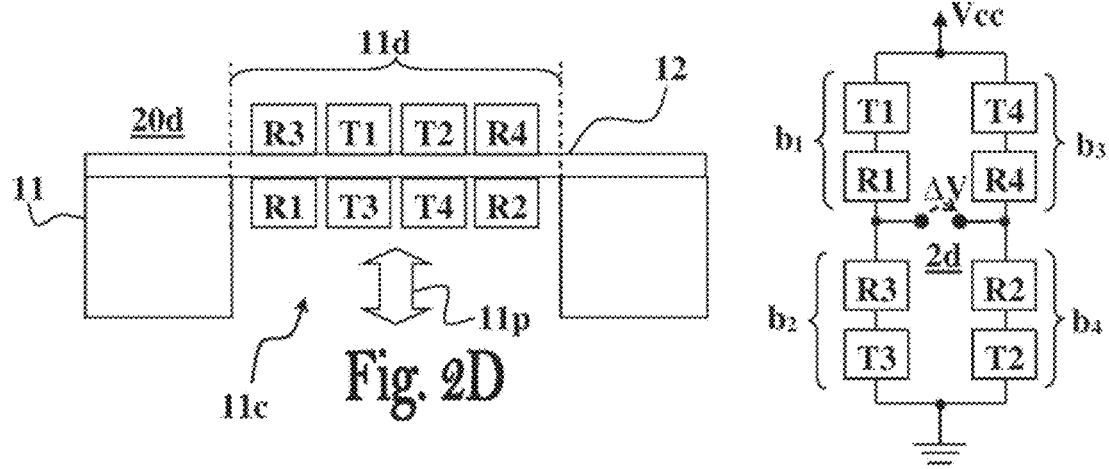

FIG. 2D shows a possible strain gauges arrangement 20d of eight piezoresistive elements formed on two opposite sides of the deformable element 11d. The strain gauges arrangement 20d according to some possible embodiments is a superposition of the strain gauges arrangement 20b shown in FIG. 2B, and of the strain gauges arrangement 20c shown in FIG. 2C. In this specific and non-limiting example two tangential piezoresistive elements, T1 and T2, are formed on a top surface area, and about a center, of the deformable element 11d, two tangential piezoresistive elements, T3 and T4, are formed on a bottom surface area, and about the center, of the deformable element 11d, two radial piezoresistive elements, R3 and R4, are formed on a top surface area, and over opposite circular peripheral sections of the deformable element 11d, and two radial piezoresistive elements, R1 and R2, are formed on a bottom surface area, and over opposite circular peripheral sections of the deformable element 11d.

Optionally, but in some embodiments preferably, the tangential and radial strain gauge elements, T1, T2, R3 and R4, formed on the top side of the deformable element 11d, and the tangential and radial strain gauge elements, T3, T4, R1 and R2, formed on the bottom side of the deformable element 11d, are substantially similar to strain gauges arrangement shown in FIG. 2B, which can also be arranged in perpendicular orientation i.e., tangential strain gauge elements T1 and T2 are at least partially enclosed in the arched wavy structure of the radial piezoresistive elements R3 and R4, respectively, and the tangential strain gauge elements T3 and T4 are at least partially enclosed in the arched wavy structure of the radial piezoresistive elements R1 and R2, respectively.

FIG. 2D further shows a possible Wheatstone bridge circuitry 2d, wherein each voltage divider branch is assembled from two different pairs of serially connected tangential and radial piezoresistive elements formed on the top and on the bottom sides of the deformable element 11d. For example, the first voltage divider branch comprises the serially connected pair of the tangential piezoresistive element T1 formed on the top side of the deformable element 11d and of the radial piezoresistive element R1 formed on the bottom side of the deformable element 11d, which is serially connected to the serially connected pair of the radial piezoresistive element R3 formed on the top side of the deformable element 11d and the tangential piezoresistive element T3 formed on the bottom side of the deformable element 11d, and the second voltage divider branch comprises the serially connected pair of the tangential piezoresistive element T4 formed on the bottom side of the deformable element 11d and the radial piezoresistive element R4 formed on the top side of the deformable element 11d, which is serially connected to the serially connected pair of the radial piezoresistive element R2 formed on the bottom side of the deformable element 11d and the tangential piezoresistive element T2 formed on the top side of the deformable element 11d.

In the configuration of FIG. 2D, assuming that the applied pressure 11p moves the deformable element outwardly, such that the tangential piezoresistive elements T1 and T2 formed on the top side of the deformable element 11d act as extension strain gauge elements, such that its electrical resistance is increased by ΔT in response to deformation of the deformable element 11d i.e., T1=T2=T+ΔT, and such that the radial piezoresistive elements R1 and R2 formed on the bottom side of the deformable element 11d act as extension strain gauge elements, which electrical resistance is increased by ΔR in response to deformation of the deformable element 11d i.e., R1=R2=R+ΔR, then the tangential piezoresistive elements T3 and T4 formed on the bottom side of the deformable element 11d act as compression strain gauge elements, that their electrical resistances are decreased by ΔT in response to deformation of the deformable element 11d i.e., T3=T4=T−ΔT, and such that the radial piezoresistive elements R3 and R4 formed on the top side of the deformable element 11d act as compression strain gauge elements, that their electrical resistances are decreased by ΔR in response to deformation of the deformable element 11d i.e., R3=R4=R-AR, then the output of the bridge circuitry 2d can be expressed by the ratio of the output voltage ΔV to the input voltage V=Vcc, as follows—

$$\frac{\Delta V}{V} = \frac{\Delta R + \Delta T}{R + T}.$$

This strain gauges design can be optimized to maximize performance (e.g., sensitivity, and/or temperature stability, and/or repeatability, and/or linearity) by maximizing the strain measurement of each strain gauge element. In this configuration each single tangential and radial strain gauge element (Ti and Ri, 1≤i≤4) can be designed to have a shorter length and an overall smaller size, because the tangential and radial strain gauge elements in each voltage divider portion $b_i$ (1≤i≤4) of the bridge circuitry 2d are serially connected to each other i.e., compared to sensor configurations 20a, 20b and 20c, wherein only one strain gauge element is used in each voltage divider portion $b_i$ (1≤i≤4), instead of each pair of serially connected tangential and radial strain gauge elements (Ri, Ti) of the sensors configuration 20d.

Figure 2E:
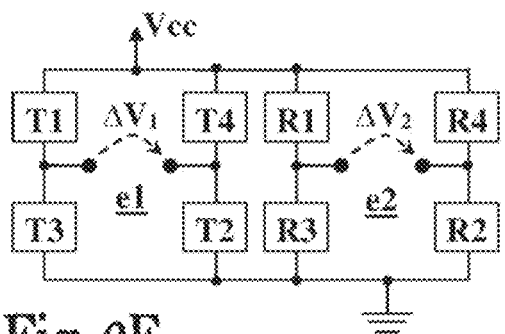
Figure 2F:
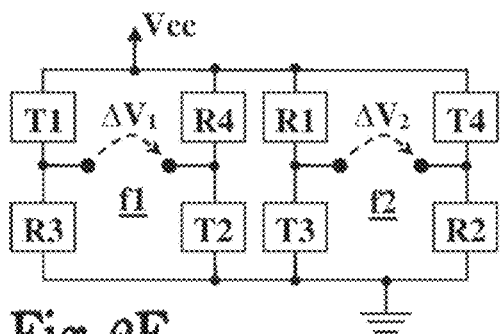

FIGS. 2E and 2F schematically illustrate configurations utilizing the multiple strain gauges Ti and Ri, (1≤i≤4) to construct multiple Wheatstone bridge circuitries on the same deformable element 11d e.g., for redundancy measurements.

FIG. 2E exemplifies construction of two Wheatstone bridge circuitries, e1 and e2, combining the bridge configurations of FIGS. 2B and 2C. Particularly, one voltage divider branch of the Wheatstone bridge circuitry e1 is constructed from the tangential piezoresistive elements T1 and T3 formed over opposite sides of the deformable element 11d, and optionally in perpendicular orientations one with respect to the other, and the other voltage divider branch of the Wheatstone bridge circuitry e1 is constructed from the tangential piezoresistive elements T4 and T2 formed over respective opposite sides of the deformable element 11d, and optionally in perpendicular orientations one with respect to the other. In the Wheatstone bridge circuitry e2, one voltage divider branch is constructed from the radial piezoresistive elements R1 and R3 formed over opposite sides of the deformable element 11d, and optionally in perpendicular orientations one with respect to the other, and the other voltage divider branch of the Wheatstone bridge circuitry e2 is constructed from the radial piezoresistive elements R4 and R2 formed over respective opposite sides of the deformable element 11d, and optionally in perpendicular orientations one with respect to the other.

FIG. 2F exemplifies construction of two Wheatstone bridge circuitries, f1 and f2, combining two bridge configurations of FIG. 2A using in each bridge circuitry piezoresistive elements located in one specific side of the deformable element 11d, and optionally perpendicular oriented with respect to the piezoresistive elements located in one specific side of the deformable element 11d. Particularly, the voltage divider branches of the Wheatstone bridge circuitry f1 are constructed from the tangential piezoresistive elements T1 and T2, and the radial piezoresistive elements R3 and R4 formed over the top side of the deformable element 11d, and the voltage divider branches of the Wheatstone bridge circuitry f2 are constructed from the tangential piezoresistive elements T3 and T4, and the radial piezoresistive elements R1 and R2 formed over the top side of the deformable element 11d.

The Wheatstone bridge circuitry 2d shown in FIG. 2D provides various advantages, such as, but not limited to:

improved temperature stability: each of the strain gauge elements T1, T2, R3 and R4, formed on the top side of the deformable element 11d, are respectively electrically connected in each of the upper and bottom portions $b_1$, $b_2$, $b_3$ and $b_4$, of the voltage divider branches of the bridge circuitry 2d in series to one of the strain gauge elements R1, R2, T3 and T4, formed on the bottom side of the deformable element 11d. In this configuration each of the strain gauge elements Ti and Ri, (1≤i≤4) are similarly affected by temperature changes, and due to the differential measurement of ΔV performed by the bridge circuitry 2d, these temperature-induced changes are substantially compensated and thereby eliminated. It is noted that the direction from which the heat causing the temperature changes is coming from is not critical, because each voltage-divider portion $b_i$ (1≤i≤4) comprises a top-side strain gauge element serially connected to a bottom-side strain gauge element, so the bridge circuitry 2d is more stable during transient temperature changes states e.g., while heat propagates from the bottom side of the deformable element towards the top side, or vice versa;

The strain gauge elements can be integrated directly onto and/or into the top and the bottom sides of the deformable element 11d and electrically connected by vias to form the bridge circuitry 2d;

Implement multiple full Wheatstone bridge circuits on the same deformable substrate e.g., membrane, for redundancy check, higher reliability and endurance;

the overall size of the sensor device can be reduced because in the configuration 20d shorter/smaller strain gauge elements can be compactly arranged on both sides of the deformable element to occupy smaller sectional area;

in addition, in the sensors configuration 20d of FIG. 2D (and also in the sensors configurations 20a, 20b and 20c, of FIGS. 2A, 2B and 2C, respectively):

in order to perform the measurements, the deformable element 11d can be attached to a deformable portion of the substrate 11 configured to define (active area—membrane e.g., as shown in FIG. 1A).

trimming elements, contacts pads, and conduction lines/tracks, can be directly integrate on/in a multilayered structure (e.g., foil or film);

additional elements can be integrated on, or in, the multilayered structure (foil/film), such as, but not limited to, pads for surface mountable devices (SMD) components.

The Wheatstone bridge circuitries 2a, 2b, 2c and 2d, respectively shown in FIGS. 2A, 2B, 2C and 2D, can be used to implement sensor devices, for example, in MEMs devices (e.g., polymeric/plastic based MEMs), as shown and described in International Patent Publication No. WO 2018/235087, and as will be further explained hereinbelow.

Figure 3A:
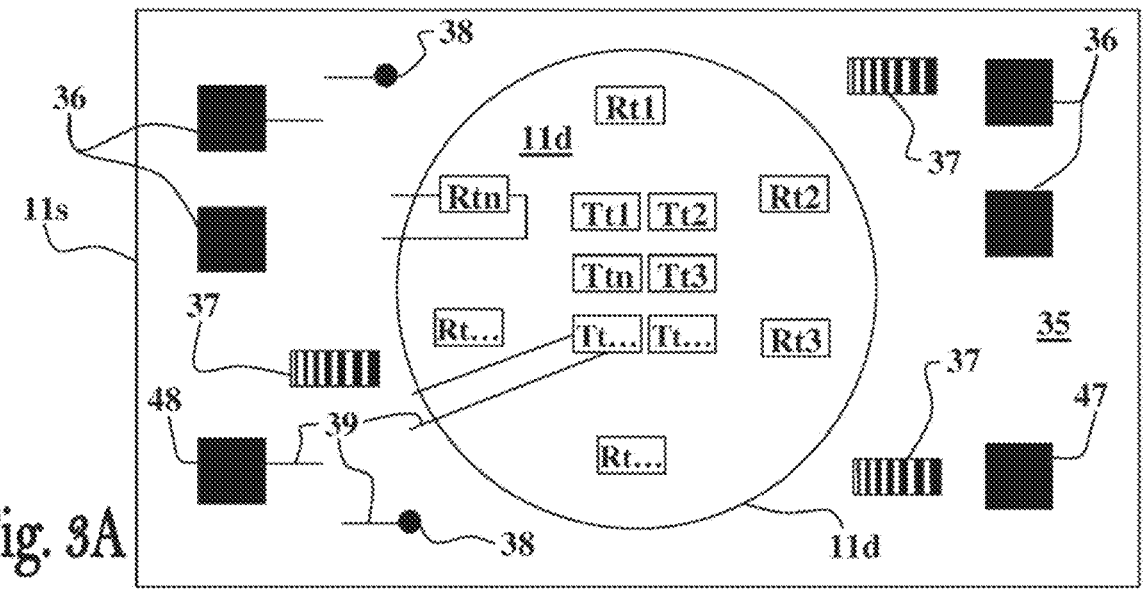
FIGS. 3A and 3B schematically illustrate sensor devices comprising according to some possible embodiments a plurality of piezoresistive elements and trimming elements, wherein FIG. 3A exemplifies possible arrangement of multiple piezoresistive and trimming elements on a substrate and FIG. 3B exemplifies construction of a bridge circuitry utilizing these piezoresistive and trimming elements.

FIG. 3A schematically illustrates a sensor device 35 comprising multiples radial and tangential strain gauge elements, Rti and Tti (where $1 \leq i \leq n$ and n>2 are integers), trimming elements 37 electrically coupled to at least some of the strain gauge elements, Rti and Tti, contact pads 36, and electrically conducting lines 39. The elements of the sensor device 35 are located on one side a substrate 11s, where the strain gauge elements Rti and Tti are located on a deformable region 11d of the substrate 11s. A similar arrangement of strain gauge elements Rti and Tti can be formed on the other side of the deformable region 11d of the substrate 11s, so one or more electrically conducting vias 38 can be formed in the substrate 11s to provide electrical connectivity between the element formed on the first and second sides of the substrate 11s. This arrangement of the sensor device 35 can be used to construct multiples Wheatstone bridge circuitries, such as bridge circuitries 2a, 2b, 2c and 2d, shown in FIGS. 2A, 2B, 2C and/or 2D, and/or other bridge circuitries not exemplified herein.

The sensor device 35 may comprise in some embodiments one of more circuitries 47 and antennas 48, mounted on the substrate and configured to communicate data (e.g., measurement data) with one or more external devices (not shown).

Figure 3B:
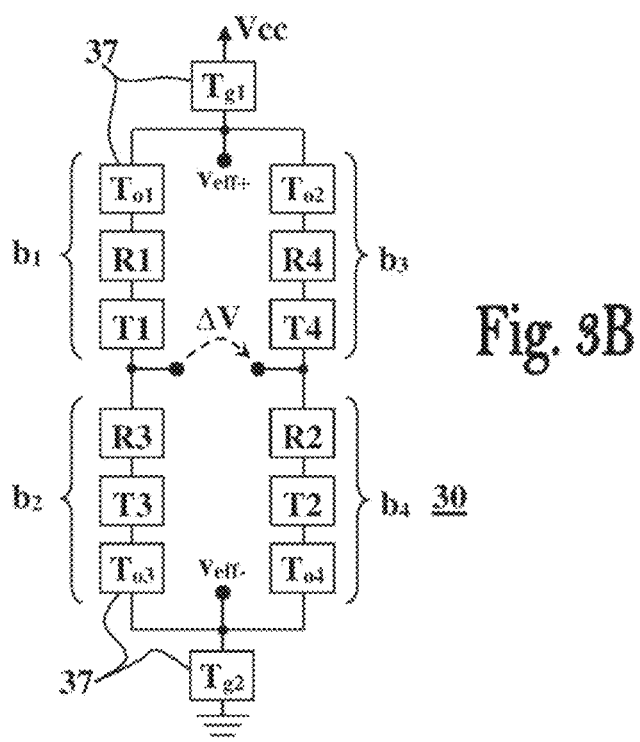

For example, FIG. 3B schematically illustrates a sensor device 30 comprising according to some possible embodiments trimming elements 37 (also referred to herein as trimming grids). The sensor device 30 comprises four radial strain gauge elements Ri, ($1 \leq i \leq 4$) and four tangential strain gauge elements Ti, ($1 \leq i \leq 4$) formed on top and bottom sides of a deformable element 11d, as shown in FIG. 2D, and electrically connected to form a Wheatstone bridge circuitry, similar to the bridge circuitry 2d of FIG. 2D, but further comprising integrated offset compensation trimming elements $T_{ox}$ (where $1 \leq x \leq 4$ is an integer) and integrated gain compensation trimming elements $T_{gy}$ (where $1 \leq y \leq 2$ is an integer).

In this example, one gain compensation trimming element $T_{g1}$ is electrically connected in series between the input voltage source Vcc and the bridge circuitry, and the other gain compensation trimming element $T_{g2}$ is electrically connected in series between the electrical ground and the bridge circuitry. In addition, each voltage divider branch portion $b_i$ ($1 \leq i \leq 4$) comprises at last one offset compensation trimming element $T_{ox}$ ($1 \leq x \leq 4$) serially connected to the respective serially connected radial and tangential strain gauge elements, Ti and Ri, ($1 \leq i \leq 4$).

Specifically, the offset compensation trimming element $T_{o1}$ is serially connected to the strain gauge elements T1 and R1 in the branch portion $b_1$, the offset compensation trimming element $T_{o2}$ is serially connected to the strain gauge elements T4 and R4 in the branch portion $b_3$, the offset compensation trimming element $T_{o3}$ is serially connected to the strain gauge elements T3 and R3 in the branch portion $b_2$, and the offset compensation trimming element $T_{o4}$ is serially connected to the strain gauge elements T2 and R2 in the branch portion $b_4$.

The offset and gain compensation trimming elements, $T_{ox}$ and $T_{gy}$, can be implemented utilizing any suitable technique, such as shown and described in International Patent Publication Nos. WO 2018/092130 and WO 2018/235087, of the same applicant hereof, and the disclosure of which is incorporated herein by reference. It is noted that some embodiments of the sensor device 30 comprise only part of the trimming elements $T_{ox}$ and $T_{gy}$ shown in FIG. 3B. For example, specific designs of the sensor device 30 can utilize only two trimming grids $T_{ox}$ ($1 \leq x \leq 2$) for the offset compensation, and only one trimming grid $T_{gy}$ (y=1) for the gain compensation.

In some configurations the offset trimming grids $T_{ox}$ can be also used for gain compensation. Alternatively, the offset trimming elements $T_{ox}$ can be electrically connected in parallel to one, or both, of the strain gauge elements Ti and Ri, of the respective branch $b_i$, or electrically connected at different positions within the voltage divider branch portions $b_i$ of the bridge circuitry (e.g., serially connected between the tangential and the radial strain gauge elements, Ti and Ri).

The gain compensation trimming elements $T_{gy}$ can be used to reduce the effective bridge voltage of the bridge circuitry (between the $V_{eff+}$ and $V_{eff-}$ terminals) and to thereby reduce the sensitivity (e.g. µV/V/mmHg, mV/V) (i.e., for the same power supply, Vcc, the effective voltage used for powering the bridge circuitry is reduced such that the measured output voltage ΔV is correspondingly reduced e.g., in µV, mV). In this specific example two gain compensation trimming elements $T_{gy}$ are used, which can be configured to adjust the output common mode voltage ΔV of the bridge to about Vcc/2.

FIG. 4A schematically illustrates a technique, and method steps, for constructing sensor devices having strain gauge elements, according to any of the sensor configurations disclosed herein. This construction technique provides a multilayered structure formed by stacking-up patterns of piezoresistive, electrically conductive, and an electrically interfacing coating/gold plating layers, on top and/or bottom sides of a thin deformable substrate (e.g., polymeric film or foil) for respectively forming strain gauge elements, conducting lines and contact electrically interfacing pads, and for electrically connecting between the elements formed on the top and bottom sides of the structure by electrically conducting vias 44, (e.g., as described and shown in International Patent Publication No. WO 2018/235087).

Optionally, but in some embodiments preferably, the substrate is made from a thin polymer/plastic film/foil having a thickness of about 5 to 5000 µm, and is some embodiments of about 12.5 to 300 µm. The piezoresistive layers applied (step S1) on the top and/or bottom sides of the substrate can be a NiCr layer having a thickness of about 0.01 to 10 µm applied by lamination, sputtering, evaporation, deposition or other suitable techniques. The conductive layer applied over the piezoresistive layer(s) (step S2) can be a Cu layer having a thickness of about 0.11 to 50 µm applied by lamination, sputtering, evaporation, deposition or other suitable techniques. The top selective coating 41t and/or the bottom coating layer 41b, applied (step S3) over the conductive layer(s), can be a Covelay layer having a thickness of about 1-1000 μm, and in some embodiments of about 5 to 250 μm, applied by lamination, evaporation, deposition, spinning coating, spraying or other suitable techniques. Changes in the thickness of the piezoresistive layers affects the measurable strains of the strain gauge elements formed in/on the top and/or bottom sensing (NiCr) layer(s).

FIG. 4B schematically illustrates a technique, and method steps, for constructing sensor devices having strain gauge elements, according to any of the sensor configurations disclosed herein. This construction technique provides a multilayered structure formed by stacking-up different patterns formed by screen printing and/or thick film manufacturing techniques and/or printing on top and/or bottom sides of deformable substrate e.g., polymeric thin film/foil e.g., having a thickness of about 5 to 5000 μm, and in some embodiments of about 12.5 to 3000 μm. In this production technique the patterned layers are selectively deposited on the substrate. For example, the following production process can be used:

1) print and, if necessary, fire (step s1) a patterned electrically resistive layer (e.g., using resistive pastes having a thickness of about 0.01 to 200 μm, and in some embodiments of about 0.01 to 10 μm) on top of the substrate (e.g., polymeric film/foil) to form strain gauge and/or trimming elements thereon;
2) drill one or more vias 44 for electrically connecting between the strain gauge elements formed on top and/or bottom sides of the substrate (step s2);
3) print an electrically conducting patterned layer e.g., having a thickness of about 0.5 to 300 μm, and is some embodiments of about 1 to 50 μm, on top of the substrate (step s3);
4) apply by vacuum "metalized" conductive paste to the top side of the vias (step s4);
5) if necessary, fire the conductive paste printed/applied on the top side of the substrate (step s5);
6) print and, if necessary, fire an electrically resistive patterned layer (e.g., using resistive pastes having a thickness of about 0.01 to 200 μm, and in some embodiments of about 0.01 to 10 μm) on the bottom side of the substrate to form strain gauge and/or trimming elements thereon (step s6);
7) print and, if necessary, fire an electrically conducting patterned layer e.g., having a thickness of about 0.5 to 300 μm, and in some embodiments of about 1 to 50 μm, on the bottom side of the substrate (step s7);
8) apply bottom coating e.g., a Covelay layer having a thickness of about 5 to 500 μm, and in some embodiment of about 5 to 250 μm (step s8);
9) trim the trimming elements of the sensor device (step s9); and
10) apply a patterned/selective coating (a Covelay layer having a thickness of about 5 to 500 μm, and in some embodiment of about 5 to 250 inn) and, if necessary, apply protective conductive electrically interfacing layer on the portions of conductive paste used to implement contact pads (e.g., gold plating) on the top side of the multilayered structure (step s10).

In case a polymeric substrate is used and the firing necessary, the firing temperature of the resistive/conductive pastes need to be adjusted to the type of polymeric material used (i.e., not too high as it may melt the substrate or deteriorate its mechanical or other physical properties).

It is noted that there can be some overlapping (not shown in FIG. 4B) between the conductive layer and the resistive layer, established while printing the conductive layer, in order to provide good electrical connection therebetween. In some embodiments the thickness of the electrically resistive layer(s) and/or of the electrically conductive layer(s), shown in FIGS. 4A and 4B, can be about 0.5 to 300 μm, and in some embodiments about 0.5 to 50 μm.

FIG. 5A shows a possible design 50 of a strain gauge device according to some possible embodiments. The strain gauge device 50 is generally of a circular shape having a radius Rm, an internal circular area 51 having a radius Rt for accommodating the tangential strain gauge elements Ti ($1 \leq i \leq n$), and a ring-shaped area 52, encircling the area 51 of the tangential strain gauge elements, and having a width d0 for accommodating the radial strain gauge elements Ri, ($1 \leq i \leq n$).

Figure 5B:
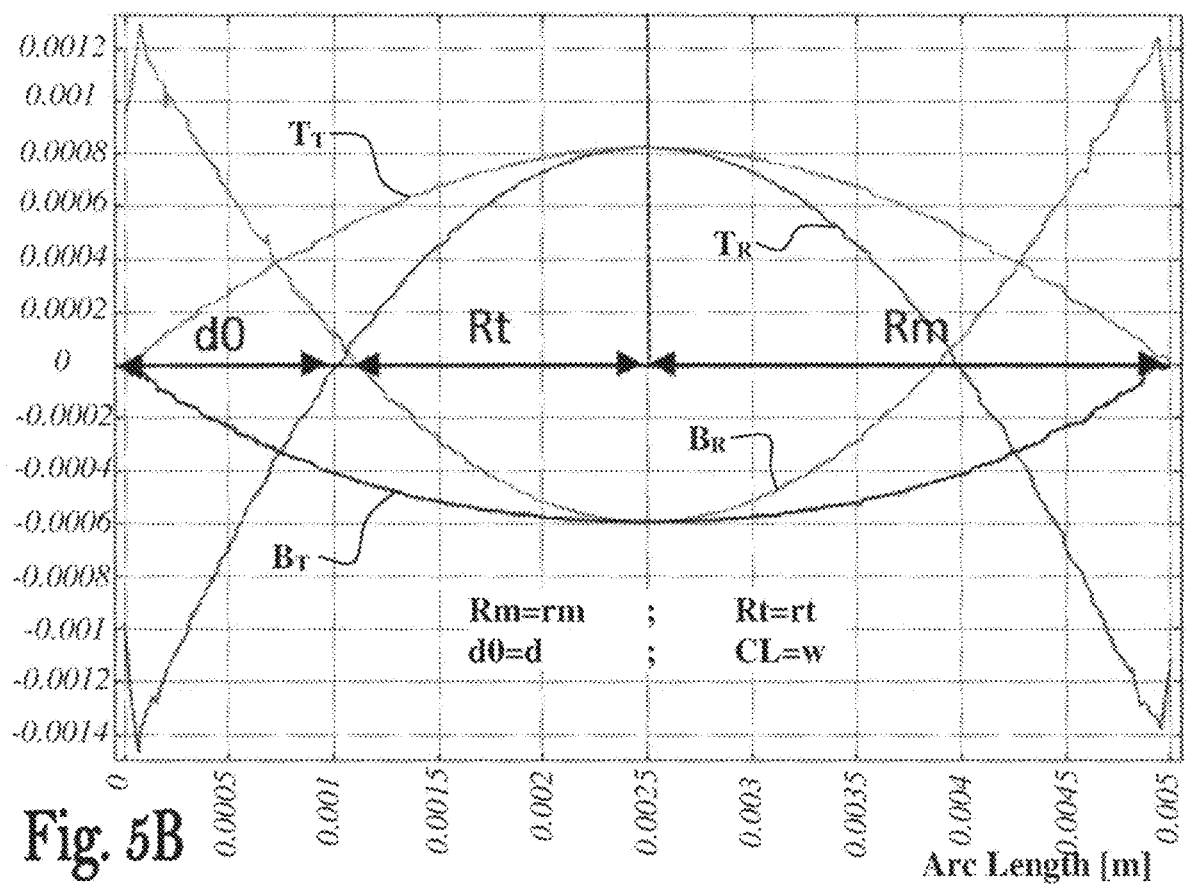
Figure 5C:
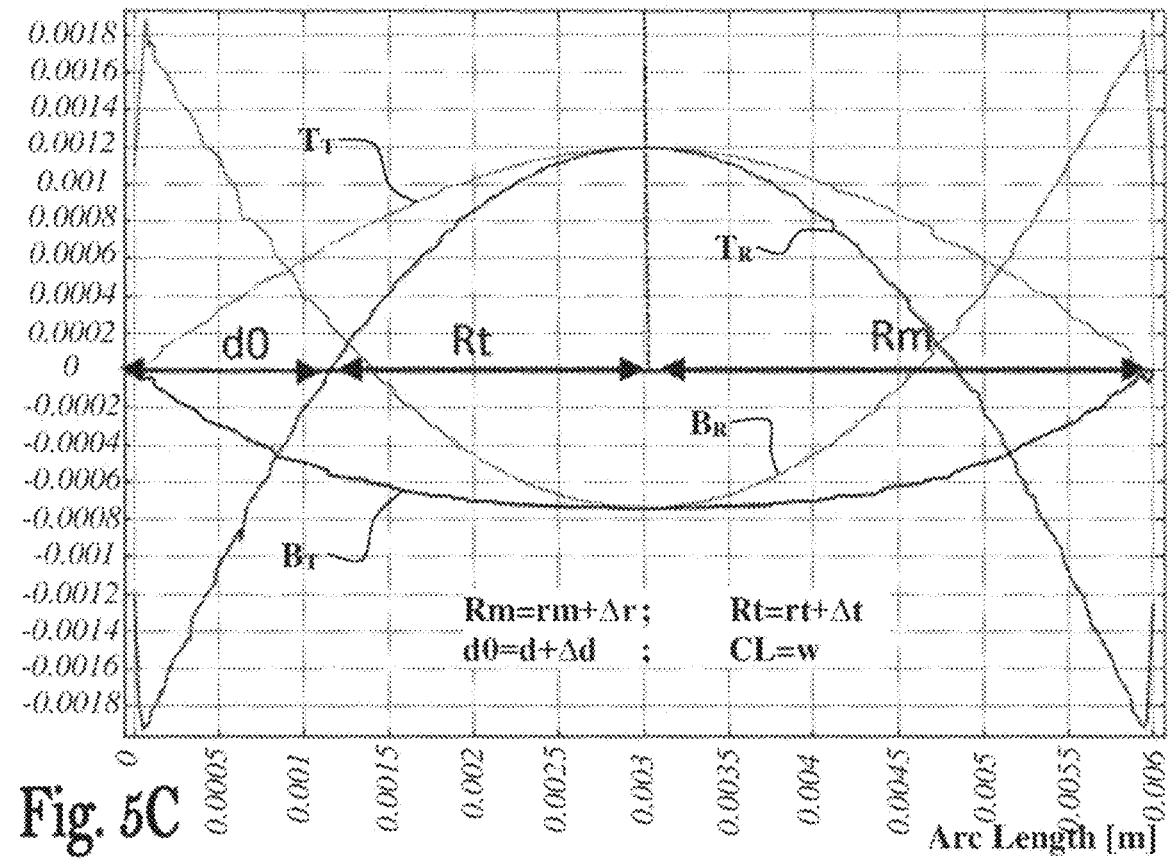
Figure 5D:
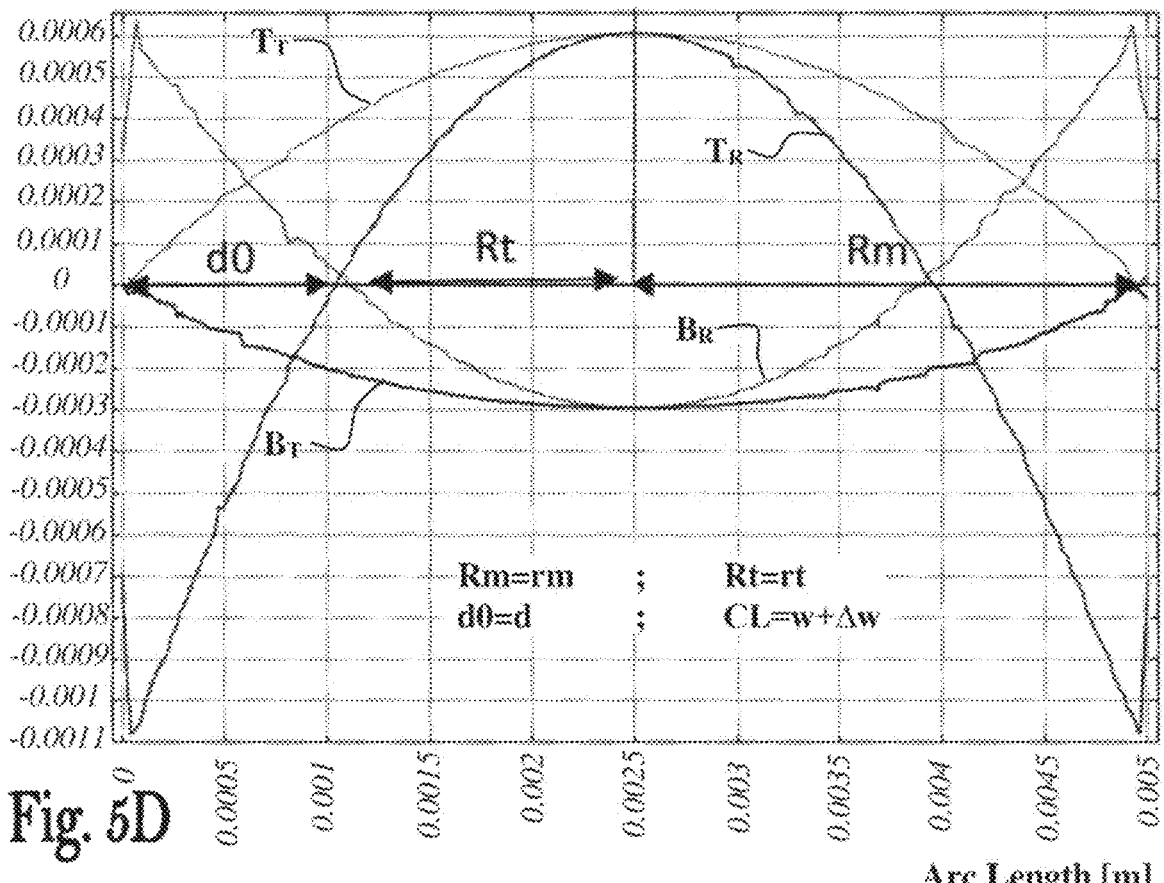
Figure 5E:
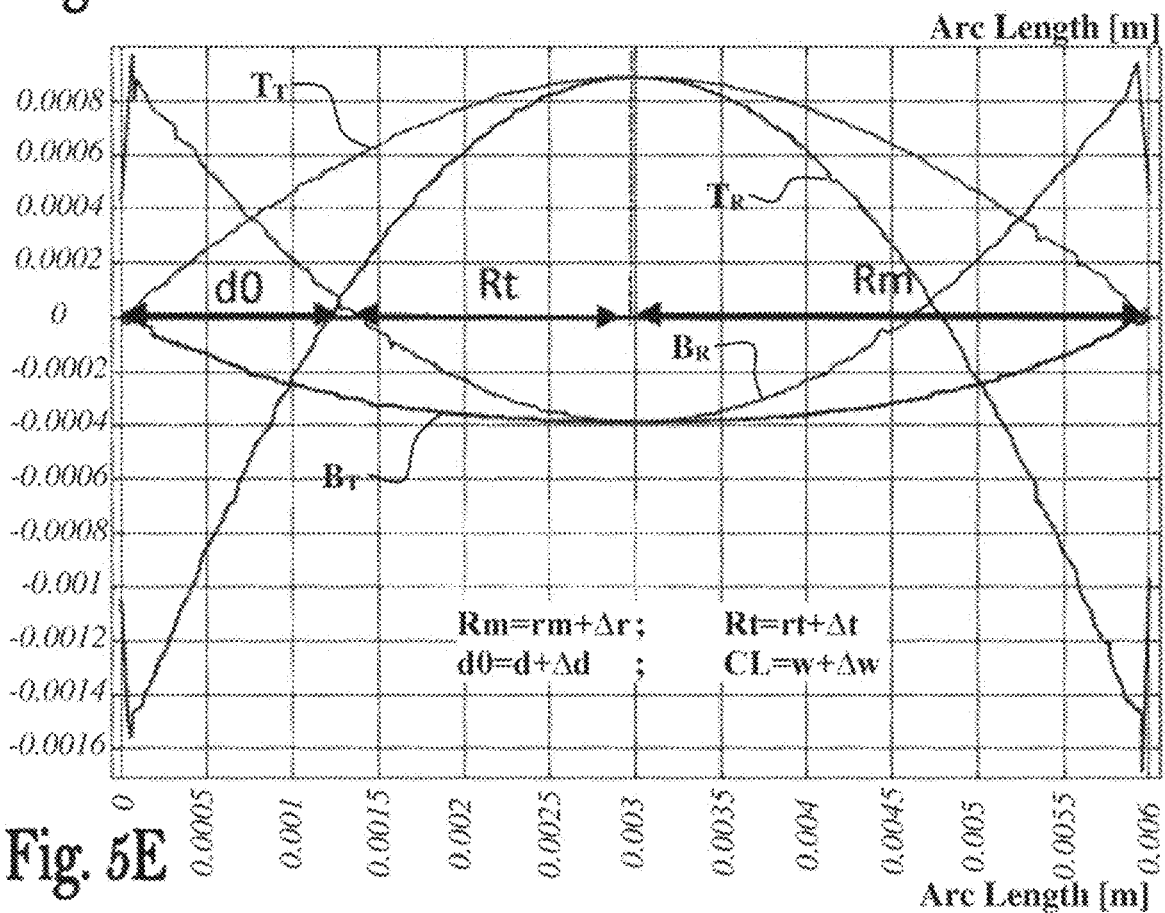

FIGS. 5B to 5E show plots of measureable strains obtained for different sizes of the sensor device 2d shown in FIG. 2D when a positive pressure is applied over the deformable element (11d), showing a plot TT of the strain measured by the top-side tangential strain gauge elements, a plot TR of the strain measured by the top-side radial strain gauge elements, a plot BT of the strain measured by the bottom-side tangential strain gauge elements, and a plot BR of the strain measured by the bottom-side radial strain gauge elements. In FIG. 5B basic dimensions of the device radius (Rm), of the internal area radius (Rt), of the ring width (d0), and of the Coverlay thickness (CL), are used. In FIG. 5C the device radius (Rm) was increased by Δr, the internal area radius (Rt) was increased by Δt, the ring width (d0) was increased by Δd, and the basic Coverlay thickness (CL) was used. In FIG. 5D only the Coverlay thickness (CL) was increased by Aw, using the basic dimensions of the device radius (Rm), internal area radius (Rt), and ring width (d0). In FIG. 5E the device radius (Rm) was increased by Δr, the internal area radius (Rt) was increased by Δt, the ring width (d0) was increased by Δd, and the Coverlay thickness (CL) was increased by Aw. As seen in FIGS. 5B to 5E, the measured strains can be adjusted by tuning the different dimensions of the various elements of sensor device 2d.

Figure 6B:
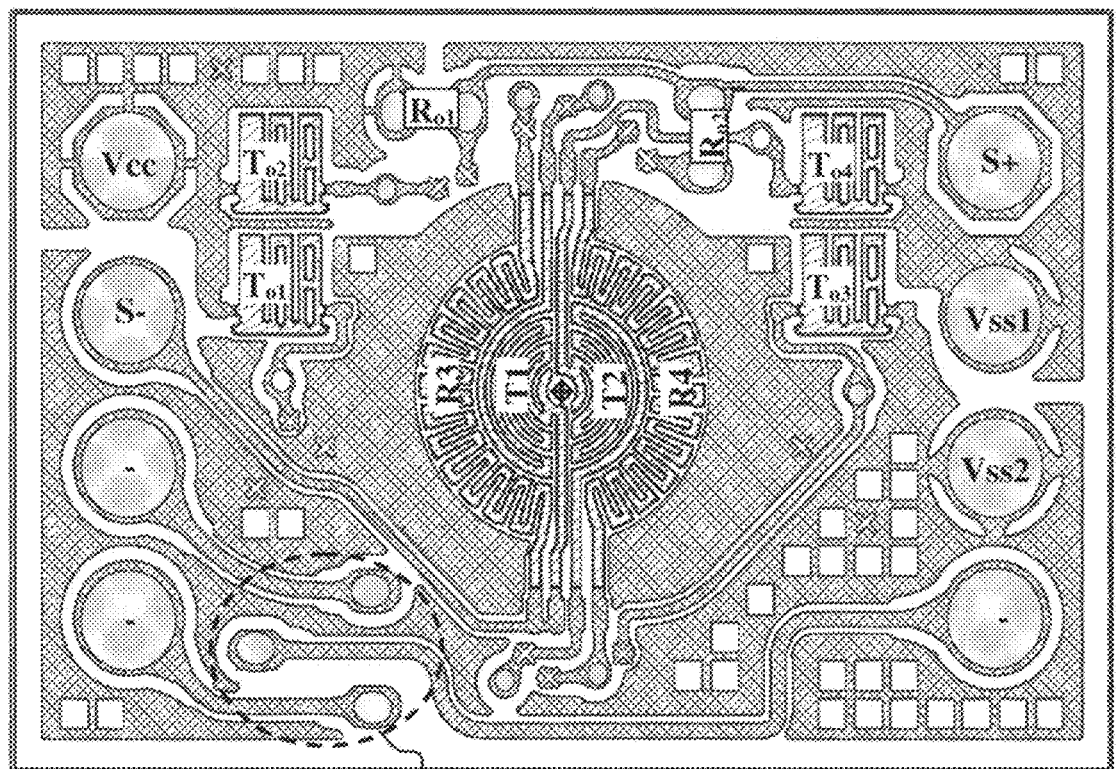
Figure 6C:
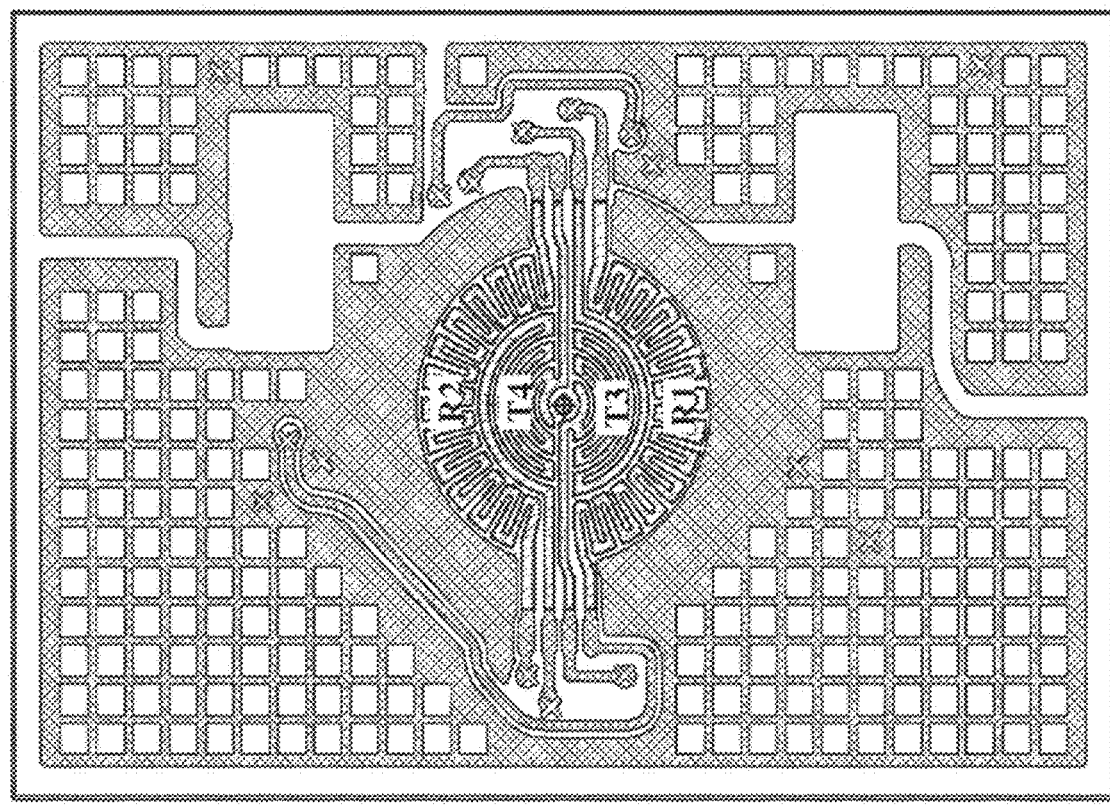

FIGS. 6A to 6C schematically illustrate a sensor device 60 according to some possible embodiments. FIG. 6A shows a bridge circuitry of the sensor device 60, and FIGS. 6B and 6C respectively show top and bottom views of a multilayered implementation the sensor device 60 constructed as shown and described in FIG. 4B. The sensor device 60 comprises in each of its voltage divider branches four strain gauge elements, as shown in FIG. 3B, but without the bottom gain compensation trimming element $T_{g2}$. In this example each of the voltage divider branches of the sensor device 60 are powered by two voltages, Vss1 and Vss2, wherein typically Vss1=Vss2. The sensor device 60 may comprise a voltage divider calibration having two serially connected resistive elements, $R_{o1}$ and $R_{o2}$, electrically connected in parallel to one of the voltage divider branches of the sensor device 60 (in this example to branch powered by the Vss1 voltage).

In FIGS. 6B and 6C, the strain gauge elements Ti and Ri, ($1 \leq i \leq 4$) and trimming elements $T_{ox}$ ($1 \leq x \leq 2$) are made of the resistive/piezoresistive material/paste, the grey circular areas are the electrical contact areas wherein conductive protective layer (e.g., gold plating) can be applied, the net-filled areas are electrically conductive patterns made of the conductive material/paste, and the "x" marks presents the vias (44). The circular electrical contacts located within the circular area 66 are configured for connection of SMD component(s).

Figure 7A:
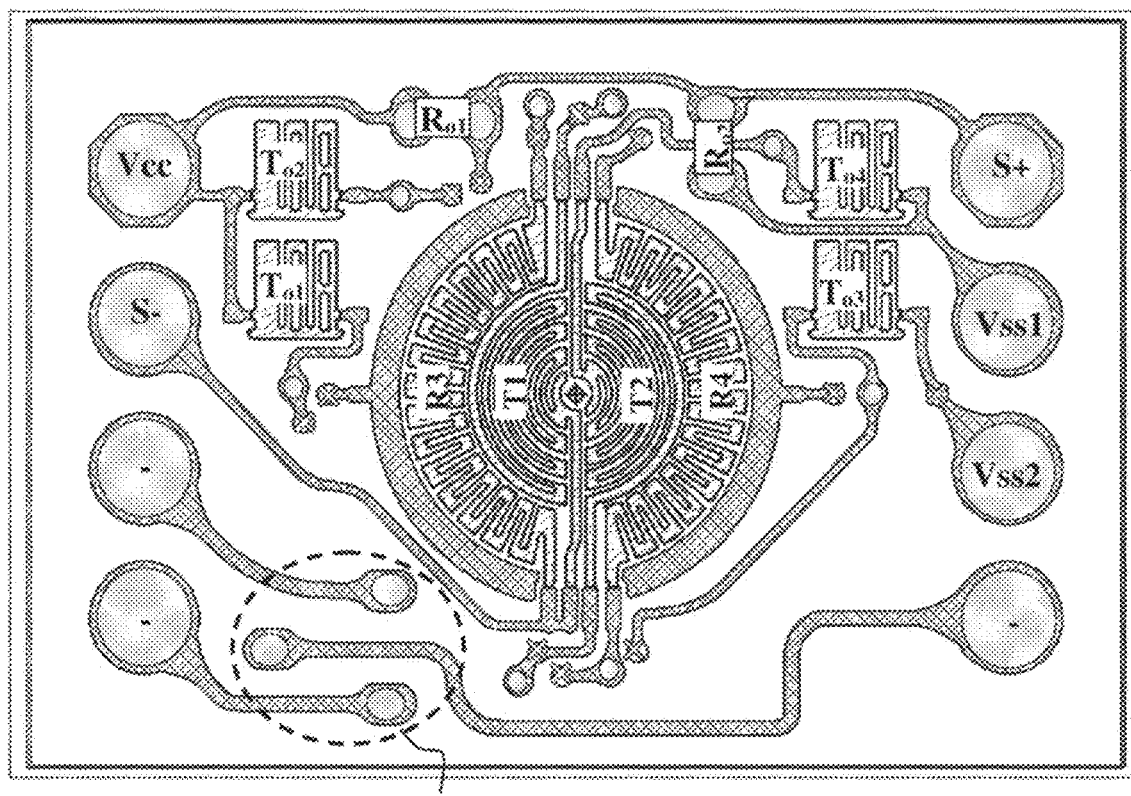
FIGS. 7A and 7B schematically illustrate shows top and bottom views of a sensor device according some other possible embodiments.
Figure 7B:
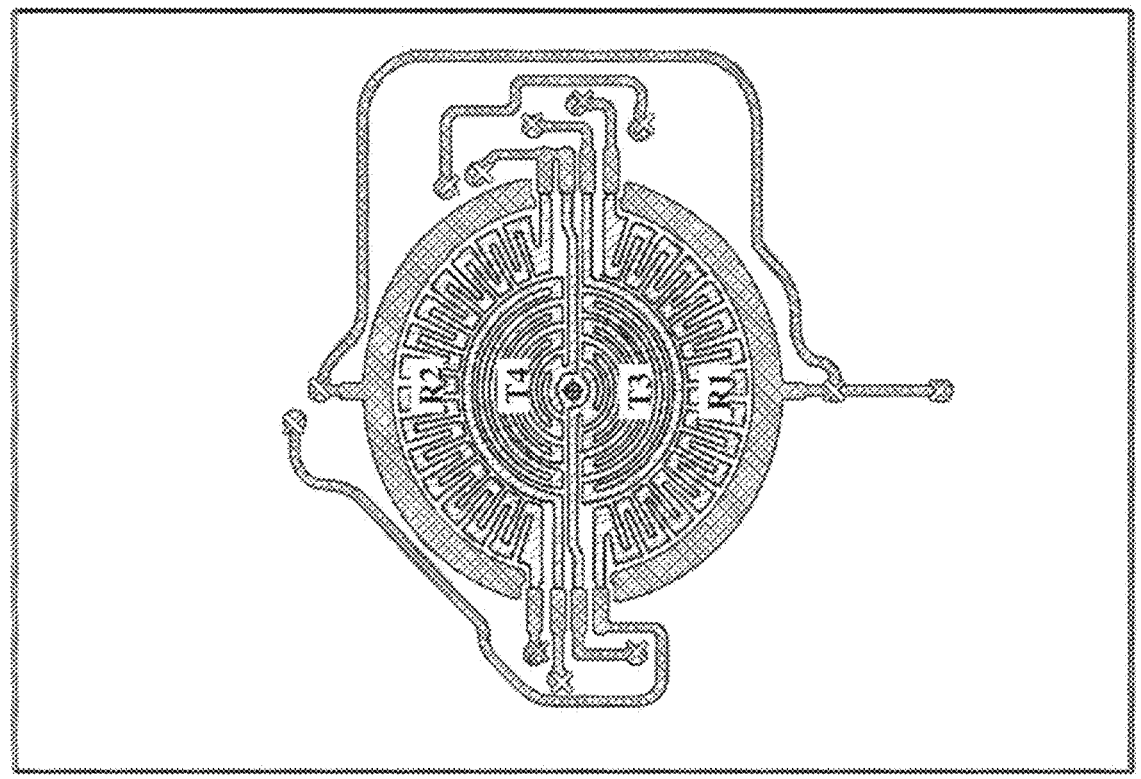

FIGS. 7A and 7B schematically illustrate a sensor device 70 demonstrating another multilayered implementation of the sensor device 60 shown in FIG. 6A, wherein FIG. 7A shows a top view and FIG. 7B shows a bottom view of the sensor device 70. As in FIGS. 6B and 6C, the strain gauge elements Ti and Ri, ($1 \le i \le 4$) and trimming elements $R_{ox}$ ($1 \le x \le 4$) are made of the resistive/piezoresistive material/paste, the grey circular areas are the electrical contact areas wherein conductive protective layer (e.g., gold plating) can be applied, the net-filled areas are electrically conductive patterns made of the conductive material/paste, and the "x" marks presents the vias (44).

The main difference between the designs of the sensor devices 60 and 70 shown in FIGS. 6 and 7, is the use of copper layer for implementing electrical ground and the power supply planes in device 60. The main advantage of these planes is shielding (e.g., against electromagnetic interferences), and can improved heat dissipation properties. On the other hand, less raw materials are required in the manufacture process of the sensor device 70 shown in FIG. 7 utilizing screen printing techniques and thick film technology or printing. The manufacturing process described in International Patent Publication No. WO 2018/235087, is based on "subtractive" manufacture processes, so there are no significant differences in the amount of raw material utilized in the designs of sensor devices 60 and 70 (an initial laminate of 5 layers is prepared, from which material can be removed (etched), in the additive manufacture process material is selectively added to the substrate/foil only where needed). The amount of raw material utilized in the additive manufacturing process e.g., of FIGS. 6A and 6B, can influence the price of the device.

In some embodiments the shape of the strain gauge elements can be changed according to design constrains (e.g., size of the deformable element), and optionally can be designed to only some portion of the deformable element area, and/or can be implemented for example by "single straight line" i.e., not requiring the alternating/interfolded (zig zag) patterns to maximize length, so smaller and simpler strain gauge elements can be implemented. This way, since the resistive element can be smaller/shorter, conductive (e.g., Copper) tracks can be placed on areas the deformable element (not shown in FIGS. 6 and 7). The parallel resistors $R_{O1}$ and $R_{O2}$ can be used for offset compensation if trimming is not performed.

Figure 8:
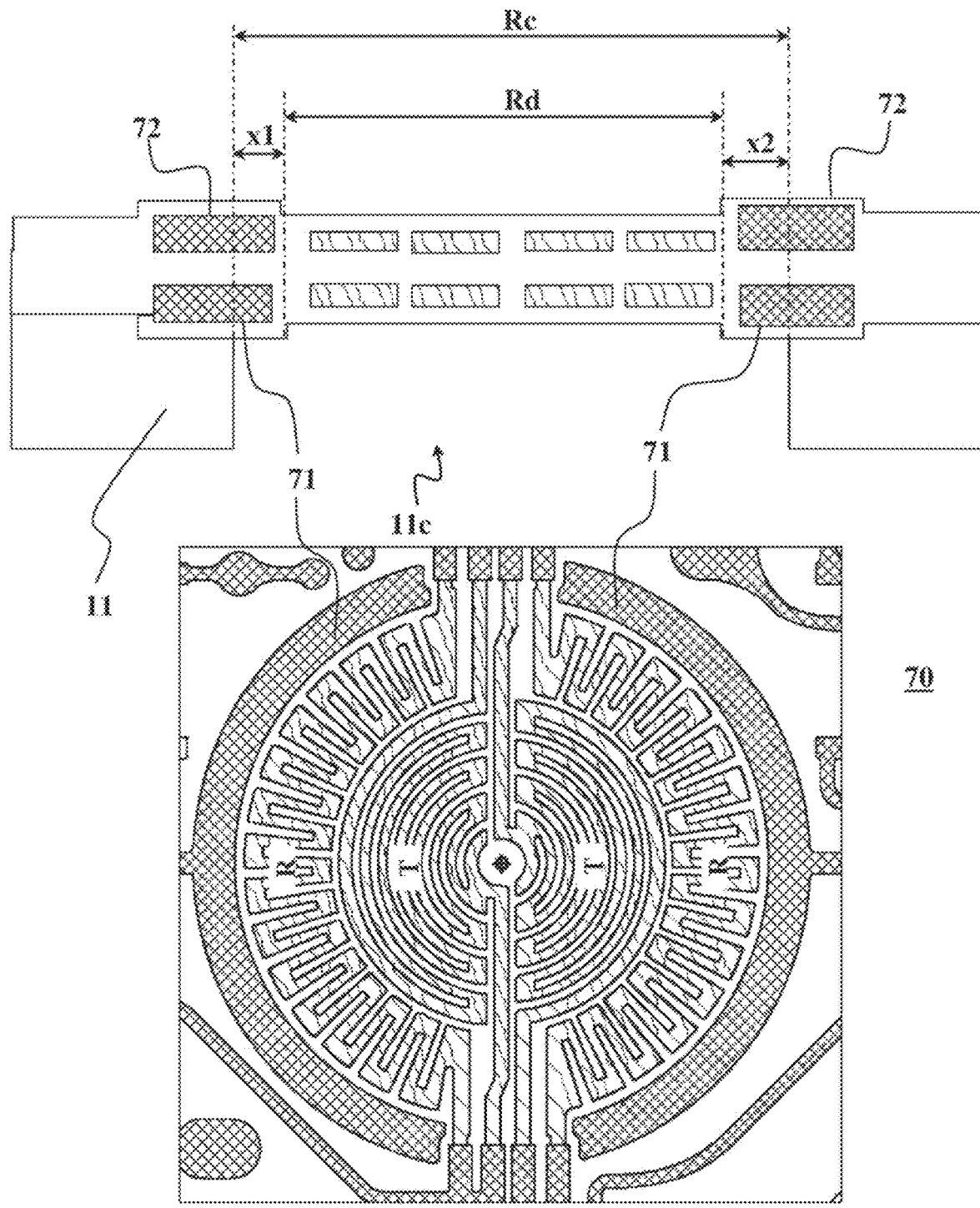
FIG. 8 shows sectional and top views of a sensor device according some other possible embodiments.

FIG. 8 shows a sectional view of the multilayered sensor device 70 according to some possible embodiments. In this design the strain gauge elements are enclosed by arc-shaped electrically conducting areas 71 that can be used to define the size of the deformable element, once the multilayered (e.g., on-foil) structure is attached to an object/substrate. The conductive areas 71 can be implemented on the top and/or the bottom sides of the substrate (foil/film)/multilayered structure. Optionally, the arc-shaped conductive areas 71 are thicker than the strain gauges areas (R/T) and can be formed choosing a material with high young modulus (stiff). Optionally, the arc-shaped conductive areas 71 are implemented as part of the electrically conductive layer.

In some embodiments the arc-shaped conductive areas 71 (also referred to herein as enclosure pattern) are applied by lithography techniques, so they can be defined with higher resolution, and can be used to compensate for the lower resolution of the attachment process. The arc-shaped conductive areas 71 can further assist in precisely positioning the sensitive sensing area of the sensor device over the "center" of the cavity 11c, and to thereby compensate centering errors that can occur due to the attachment process. If, for example, the radius Rc of the cavity 11c is 5.2 mm, the inner diameter Rd of arc-shaped areas 71 can be 5 mm. Since the arc-shaped areas 71 are thicker, the actual/effective diameter of the deformable element in this non-limiting example is Rd=5 mm, such that there is a 0.2 mm ($\approx$x1+x2) allowable error during the centering process. The arc-shaped areas 71 can further improve thermal dissipation and/or electromagnetic shielding of the sensor device.

The sensor device 70 may be designed to include top and/or bottom ring-shaped protrusions 72 encircling the area accommodating the strain gauge elements. The ring-shaped protrusions 72 can be introduced, or not, according to the coating method used, and if introduced, their height above the surface of the device can be in the range of few microns to hundreds of microns.

FIGS. 9A and 9B, schematically illustrate a sensor assembly 90 having multiple sensing devices 95a, 95b and 95c, as may needed in various applications wherein there are different, or changing, requirements regarding the measured parameters and the measurement ranges. Accordingly, each of the sensing devices 95a, 95b and 95c, can be configured to measure a different range of a measured parameter/property (e.g., fluid pressure), and/or a different parameter/property. Each sensing device 95a, 95b and 95c, may be implemented by an array of one or more sensing elements configured to form one or more bridge circuitries, utilizing same, or different, specification per sensor element. The use of several identical sensor elements may improve the accuracy and the reliability of the measurements. This way, the measurement range of the sensor assembly 90 can be significantly increased e.g., by providing a wider measurement range of the pressure while guaranteeing that each sensor device is operated in its linear measurement range.

As exemplified in FIG. 9A, the sensor assembly 90 may comprise a cover member 91 having a plurality of cavities, 91a, 91b and 91c, of different dimensions/sizes, a deformable substrate 95 having a respective plurality of sensing devices 95a, 95b and 95c, located on at least one side thereof over locations corresponding to the locations of the cavities, 91a, 91b and 91c, and an attachment member 92 having a respective plurality of pass-through bores 92a, 92b and 92c, which locations and dimensions/sizes correspond to the locations and dimensions/sizes of the sensing devices 95a, 95b and 95c. When assembled together, the deformable substrate 95 is attached to the cover member 91 such that sections areas thereof carrying the sensing devices 95a, 95b and 95c, are located over the cavities, 91a, 91b and 91c, and the attachment member 92 is attached to the deformable substrate 95 such that its pass-through bores 92a, 92b and 92c, are placed over the locations of the deformable substrate 95 carrying the sensing devices 95a, 95b and 95c.

The sensor assembly 90 can be sealably attached to an opening of a fluid vessel or tube (not shown) by its attachment member 92, for its pass-through bores 92a, 92b and 92c, to fluidly communicate therewith such that the locations of the deformable substrate 95 carrying the sensing devices 95a, 95b and 95c, interact with fluid media of the fluid vessel or tube through the pass-through bores 92a, 92b and 92c. This way, the locations of the deformable substrate 95 carrying the sensor devices 95a, 95b and 95c, can be deformed into, or out of, the respective cavities, 91a, 91b and 91c of the cover member 91, and thereby measure different value ranges of one or more properties, conditions or parameters (e.g., fluid pressure), of the fluid media.

Terms such as top, bottom, front, back, right, and left and similar adjectives in relation to orientation of the sensor devices/elements and their components refer to the manner in which the illustrations are positioned on the paper, not as any limitation to the orientations in which the apparatus can be used in actual applications.

It should also be understood that throughout this disclosure, where a process or method is shown or described, the steps of the method may be performed in any order or simultaneously, unless it is clear from the context that one step depends on another being performed first.

As described hereinabove and shown in the associated figures, the present disclosure provides multilayered sensor devices and related methods. While particular embodiments of the invention have been described, it will be understood, however, that the invention is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the claims.

The invention claimed is:

1. A sensor device comprising:
   a deformable substrate;
   a plurality of sensing elements formed on or in first and second sides of said deformable substrate, each of said plurality of sensing elements comprises at least one of the following: (i) a plurality of strain sensitive lines radially extending with respect to a center of the sensor device; and (ii) a plurality of strain sensitive lines extending along a circular section with respect to the center of the sensor device; and
   one or more electrically conducting vias formed in said deformable substrate for electrically connecting between one or more of the sensing elements formed on said first side of said deformable substrate and one or more of the sensing elements formed on said second side of said deformable substrate.

2. The sensor device of claim 1, wherein at least one of the sensing elements comprising the plurality of strain sensitive lines extending along a circular section is at least partially accommodated within a pattern formed by another sensing element comprising the plurality of radially extending strain sensitive lines.

3. The sensor device of claim 1, further comprising an enclosure pattern formed in or on at least one of the first or second sides of the device for at least partially surrounding at least some of said plurality of sensing elements.

4. The sensor device of claim 1, further comprising at least one piezoresistive layer patterned on or in at least one side of the deformable substrate, and at least one electrically conducting layer patterned on or in said at least one side of the deformable substrate with some overlap with said at least one piezoresistive layer, and at least one coating layer patterned to partially, or entirely, cover said piezoresistive and electrically conducting layers.

5. The sensor device of claim 4, further comprising one of the following:
   respective first and second piezoresistive layers patterned on or in the first and second sides of the deformable substrate, respective first and second electrically conducting layers patterned on or in the first and second sides of said deformable substrate with some overlap with said at least one piezoresistive layer, and at least one coating layer substantially covering said piezoresistive and electrically conducting layers on or in the second side of the deformable substrate, at least one coating layer selectively covering portions of said piezoresistive and electrically conducting layers on or in the first side of the deformable substrate, and at least one via electrically connecting between the electrically conducting layers patterned on or in the first and second sides of the deformable substrate; or
   respective first and second piezoresistive layers patterned on or in portions of the first and second sides of the deformable substrate, respective first and second electrically conducting layers patterned on or in some portions of said first and second sides of said deformable substrate with some overlap with said piezoresistive layers, and at least one coating layer patterned to substantially cover said piezoresistive and electrically conducting layers on or in the second side of the deformable substrate, at least one coating layer patterned to selectively cover portions of said piezoresistive and electrically conducting layers on or in the first side of the deformable substrate, and at least one via electrically connecting between the electrically conducting layers patterned on or in the first and second sides of the deformable substrate.

6. The sensor device of claim 5, further comprising an electrically interfacing layer selectively patterned on portions of the electrically conducting layers on the first side of the deformable substrate that are not covered by the selectively patterned at least one coating layer.

7. The sensor device of claim 1, further comprising at least two radial sensing elements comprising the plurality of radially extending strain sensitive lines formed on or in a peripheral region of the first side of the deformable substrate, and at least two radial strain gauge elements comprising the plurality of radially extending strain sensitive lines formed on or in a peripheral region of the second side of the deformable substrate.

8. The sensor device of claim 1, further comprising one of the following:
   at least two tangential sensing elements comprising the plurality of strain sensitive lines extending along a circular section formed on or in a central region of the first side of the deformable substrate, and at least two tangential strain gauge elements comprising the plurality of strain sensitive lines extending along a circular section formed on or in a central region of the second side of the deformable substrate; or
   at least four tangential sensing elements comprising the plurality of strain sensitive lines extending along a circular section formed on or in central regions of the first and second sides of said deformable substrate, and at least four radial sensing elements comprising the plurality of radially extending strain sensitive lines formed on or in central regions of the first and second sides of said deformable substrate.

9. The sensor device of claim 8, wherein the sensing elements are electrically connected to form at least one bridge circuitry having two voltage divider branches, wherein each portion of each voltage divider branch comprises at least one radial sensing element formed on the first side of the deformable substrate and at least one tangential sensing element formed on the second side of the deformable substrate.

10. The sensor device of claim 1, wherein at least some portions of the strain sensitive lines of the sensing elements located on or in the first side of the deformable substrate are perpendicularly oriented with respect to at least some portions of the strain sensitive lines of the sensing elements located on or in the second side of the deformable substrate.

11. The sensor device of claim 1, further comprising at least one trimming element electrically connected to at least one of the sensing elements.

12. A sensor assembly comprising two of more of the sensor devices of claim 1 formed on the deformable substrate, each of said two of more of the sensor devices configured to measure a different range or parameter of a fluid media.

13. The sensor assembly of claim 12, further comprising a cover member configured to attach to one side of the deformable substrate and having two or more cavities, each of said cavities having dimension and location configured to engage a portion of the deformable substrate carrying a respective one of the two or more sensor devices, and an attachment member configured to attach to another side of the deformable substrate and having two or more pass-through bores, each of said pass-through bores having location and dimension configured to engage a portion of the deformable substrate carrying a respective one of the two or more sensor devices.

14. A method of making the sensor device of claim 1, the method comprising:
patterning at least one piezoresistive layer on or in at least one side of the deformable substrate to form the at least one sensing element having the plurality of strain sensitive lines radially extending with respect to the center of said sensor device or the plurality of strain sensitive lines extending along a circular section about said center of the sensor device
patterning at least one electrically conducting layer on or in said at least one side of the deformable substrate for establishing electrical contact with said at least one sensing element and
applying at least one coating layer to partially, or entirely, cover said piezoresistive and electrically conducting layers.

15. The method of claim 14, further comprising patterning the at least one piezoresistive layer on or in the first and second sides of the deformable substrate, patterning the at least one electrically conducting layer on or in said first and second sides of said deformable substrate, forming the at least one electrically conducting via in said deformable substrate for electrically connecting between the electrically conducting layers patterned on or in the first and second sides of the deformable substrate, patterning a first one of the at least one coating layer to substantially cover said piezoresistive and electrically conducting layers on or in the second side of the deformable substrate, and patterning a second one of the at least one coating layer to selectively cover portions of said piezoresistive and electrically conducting layers on or in the first side of the deformable substrate.

16. The method of claim 14, further comprising patterning the at least one piezoresistive layer on or in portions of first and second sides of the deformable substrate, patterning the at least one electrically conducting layer on or in some portions of said first and second sides of said deformable substrate with some overlap with said piezoresistive layers, forming the at least one electrically conducting via in said deformable substrate for electrically connecting between the electrically conducting layers patterned on or in the first and second sides of the deformable substrate, applying the at least one coating layer to substantially cover said piezoresistive and electrically conducting layers on or in the second side of the deformable substrate, and applying at least one other coating layer to selectively cover portions of said piezoresistive and electrically conducting layers on or in the first side of the deformable substrate.

17. The method of claim 15, further comprising selectively patterning an electrically interfacing layer on portions of the electrically conducting layers on or in the first side of the deformable substrate that are not covered by the selectively patterned at least one coating layer.

18. The method of claim 14, wherein the patterning of the at least one piezoresistive layer is configured to form at least one trimming element, the patterning of the at least one electrically conducting layer is configured to electrically connect between the at least one sensing element and the at least one trimming element, and wherein the method comprising trimming said at least one trimming element before the applying of the at least one coating layer.

19. A sensor device comprising:
a deformable substrate; and
a plurality of sensing elements formed on or in first and second sides of said deformable substrate, each of said plurality of sensing elements comprises at least one of the following: (i) a plurality of strain sensitive lines radially extending with respect to a center of the sensor device; and (ii) a plurality of strain sensitive lines extending along a circular section with respect to the center of the sensor device,
wherein at least some portions of the strain sensitive lines of the sensing elements located on or in the first side of the deformable substrate are perpendicularly oriented with respect to at least some portions of the strain sensitive lines of the sensing elements located on or in the second side of the deformable substrate.

20. A sensor device comprising:
a deformable substrate;
first and second piezoresistive layers respectively patterned on or in first and second sides of said deformable substrate to thereby form a plurality of sensing elements, each of said plurality of sensing elements comprises at least one of the following: (i) a plurality of strain sensitive lines radially extending with respect to a center of the sensor device; and (ii) a plurality of strain sensitive lines extending along a circular section with respect to the center of the sensor device; and
first and second electrically conducting layers respectively patterned on or in said first and second sides of the deformable substrate with some overlap with said at least one piezoresistive layer, so as to provide electrical connectivity to and/or between said plurality of sensing elements and thereby facilitate construction of either a single bridge circuitry using sensing elements on or in said first and second sides of the deformable substrate, or a plurality of bridge circuitries each using sensing elements on or in at least one of said first and second sides of the deformable substrate.

* * * * *